United States Patent
Nishimura et al.

(10) Patent No.: US 7,641,406 B2
(45) Date of Patent: Jan. 5, 2010

(54) BEVEL INSPECTION APPARATUS FOR SUBSTRATE PROCESSING

(75) Inventors: Joichi Nishimura, Kyoto (JP); Hiroshi Yoshii, Kyoto (JP); Koji Nishiyama, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 0 days.

(21) Appl. No.: 12/179,522

(22) Filed: Jul. 24, 2008

(65) Prior Publication Data

US 2009/0027634 A1 Jan. 29, 2009

(30) Foreign Application Priority Data

Jul. 26, 2007 (JP) .............................. 2007-195031
Jul. 26, 2007 (JP) .............................. 2007-195032

(51) Int. Cl.
*G03D 5/00* (2006.01)
*G03B 27/32* (2006.01)
*G03C 5/00* (2006.01)

(52) U.S. Cl. ............................. 396/611; 355/27; 430/30

(58) Field of Classification Search ................. 396/611; 355/27; 430/30; 134/902
See application file for complete search history.

(56) References Cited

U.S. PATENT DOCUMENTS

| 6,874,515 | B2 | 4/2005 | Ishihara et al. |
| 6,893,171 | B2 | 5/2005 | Fukutomi et al. |
| 2006/0045722 | A1 | 3/2006 | Hashimoto |
| 2006/0291855 | A1 | 12/2006 | Shigemori et al. |
| 2007/0190437 | A1 | 8/2007 | Kaneyama et al. |
| 2007/0229789 | A1 | 10/2007 | Kawamura |

FOREIGN PATENT DOCUMENTS

| JP | 2003-324139 | | 11/2003 |
| JP | 2006-080403 | * | 3/2006 |
| JP | 2006-080404 | * | 3/2006 |
| JP | 2007-214365 | | 8/2007 |
| JP | 2007-235089 | | 9/2007 |
| JP | 2007-266074 | | 10/2007 |
| WO | WO 99/49504 | | 9/1999 |
| WO | WO 2006/027900 | | 3/2006 |
| WO | WO 2006/028173 | | 3/2006 |

OTHER PUBLICATIONS

English Translation of JP 2006-080403 (dated Mar. 2006).*
English Translation of JP 2006-080404 (dated Mar. 2006).*

* cited by examiner

*Primary Examiner*—Alan A Mathews
(74) *Attorney, Agent, or Firm*—Townsend and Townsend and Crew LLP

(57) ABSTRACT

A substrate processing apparatus includes an indexer block, an anti-reflection film processing block, a resist film processing block, a development processing block, a resist cover film processing block, a resist cover film removal block, and an interface block. The interface block includes a bevel portion inspection unit. The bevel portion inspection unit inspects a bevel portion of a substrate to determine whether or not the bevel portion of the substrate is contaminated. The substrate whose bevel portion is determined to be contaminated and the substrate whose bevel portion is determined that it is not contaminated are respectively subjected to different types of processing.

16 Claims, 24 Drawing Sheets

F I G. 5
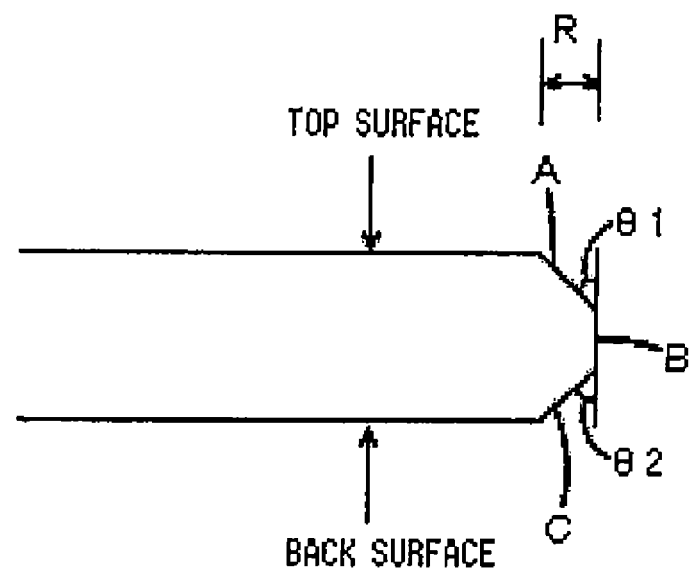

BEVEL INSPECTION APPARATUS FOR SUBSTRATE PROCESSING

CROSS-REFERENCES TO RELATED APPLICATIONS

This application claims priority to Japanese Patent Application 2007-195031, filed Jul. 26, 2007 and Japanese Patent Application 2007-195032, filed Jul. 26, 2007. The disclosures of JP 2007-195031 and JP 2007-195032 are hereby incorporated by reference in their entirety for all purposes.

BACKGROUND OF THE INVENTION

1. Field of the Invention

The present invention relates to a substrate processing apparatus that subjects substrates to processing.

2. Description of the Background Art

Substrate processing apparatuses are used to subject various types of substrates such as semiconductor substrates, substrates for liquid crystal displays, plasma displays, optical disks, magnetic disks, and magneto-optical disks, photomasks, and other substrates to various types of processing.

Such a substrate processing apparatus generally subjects a single substrate to a plurality of different types of processing successively. A substrate processing apparatus as described in JP 2003-324139 A includes an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried thereinto from the indexer block is transported to the exposure device through the interface block after being subjected to anti-reflection film formation and resist film coating processing in the anti-reflection film processing block and the resist film processing block. After the resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Conventional exposure devices have generally performed exposure processing by reduction-projecting reticle patterns on substrates through projection lenses. In such conventional exposure devices, however, the line widths of exposure patterns are determined by the wavelengths of light sources of the exposure devices. Therefore, making finer resist patterns has had limitations.

Therefore, as projection exposure methods allowing for finer exposure patterns, a liquid immersion method is suggested (see, e.g., WO99/49504 pamphlet). In the projection exposure device according to the WO99/49504 pamphlet, an area between a projection optical system and a substrate is filled with a liquid, resulting in a shorter wavelength of exposure light on a top surface of the substrate. This allows for a finer exposure pattern.

In the projection exposure device according to the above-mentioned WO99/49504 pamphlet, however, exposure processing is performed with the substrate and the liquid brought into contact with each other. When a contaminant adheres to the substrate before the exposure processing, the contaminant is mixed into the liquid.

Although the substrate is subjected to various types of film formation processing before the exposure processing, a bevel portion of the substrate or its peripheral portion may, in some cases, be contaminated in the process of the film formation processing. When the substrate is subjected to the exposure processing in the state, a lens of the exposure device may be contaminated, resulting in a defective dimension and a defective shape of the exposure pattern.

With the bevel portion or the peripheral portion of the substrate contaminated even during the film formation processing of the substrate, films may not be normally formed on the substrate.

SUMMARY OF THE INVENTION

An object of the present invention is to provide a substrate processing apparatus that can prevent defective processing caused by contamination of a bevel portion of a substrate.

Another object of the present invention is to provide a substrate processing apparatus that can prevent defective processing caused by contamination of an end portion of a substrate.

(1) According to an aspect of the present invention, a substrate processing apparatus that is arranged adjacent to an exposure device includes a processing section for subjecting a substrate to processing, an interface provided adjacent to one end of the processing section for receiving and transferring the substrate between the processing section and the exposure device, and a controller that controls the respective operations of the processing section and the interface, in which at least one of the processing section and the interface includes a bevel portion inspection device that inspects the state of a bevel portion of the substrate to determine whether or not the bevel portion of the substrate is contaminated, and the controller performs a first control operation when the bevel portion inspection device determines that the bevel portion of the substrate is contaminated, while performing a second control operation when the bevel portion inspection device determines that the bevel portion of the substrate is not contaminated.

In the substrate processing apparatus, the processing section subjects the substrate to predetermined processing, and the interface receives and transfers the substrate from the processing section to the exposure device. After the exposure device subjects the substrate to the exposure processing, the interface returns the substrate after the exposure processing from the exposure device to the processing section. The controller controls the respective operations of the processing section and the interface.

In at least one of the processing section and the interface, the bevel portion inspection device inspects the state of the bevel portion of the substrate, to determine whether or not the bevel portion of the substrate is contaminated. The controller performs the first control operation when the bevel portion inspection device determines that the bevel portion of the substrate is contaminated, while performing the second control operation when the bevel portion inspection device determines that the bevel portion of the substrate is not contaminated.

The first or second control operation is thus performed on the basis of the results of the determination whether or not the bevel portion is contaminated, which can prevent defective processing of the substrate due to the contamination of the bevel portion of the substrate.

(2) The bevel portion inspection device may inspect the bevel portion of the substrate before exposure processing by the exposure device, and the controller may control the interface such that the substrate is not transported to the exposure device as the first control operation when the bevel portion inspection device determines that the bevel portion of the substrate is contaminated before the exposure processing.

In this case, the substrate whose bevel portion has been contaminated is not transported to the exposure device, which prevents contamination in the exposure device. This prevents a defective dimension and a defective shape of an exposure pattern.

(3) At least one of the processing section and the interface may include a cleaning processing unit that subjects the substrate before the exposure processing by the exposure device to cleaning processing, the bevel portion inspection device may inspect the bevel portion of the substrate after the cleaning processing by the cleaning processing unit, and the controller may control at least one of the processing section and the interface such that the substrate is not transported to the exposure device as the first control operation when the bevel portion inspection device determines that the bevel portion of the substrate is contaminated after the cleaning processing.

In this case, after the cleaning processing unit subjects the substrate to the cleaning processing, the bevel portion inspection device inspects the state of the bevel portion of the substrate. Therefore, the ratio of the substrates whose bevel portions are determined to be contaminated is reduced. This causes the ratio of the substrates that are transported to the exposure device to be increased, resulting in improved yield.

(4) The controller may control at least one of the processing section and the interface such that the substrate is subjected to the cleaning processing by the cleaning processing unit again as the first control operation when the bevel portion inspection device determines that the bevel portion of the substrate is contaminated.

In this case, after the cleaning processing unit removes a contaminant that adheres to the bevel portion of the substrate, the substrate can be transported to the exposure device. This results in further improved yield.

(5) The cleaning processing unit may include a bevel portion cleaning mechanism for cleaning the bevel portion of the substrate.

In this case, the cleaning processing unit can sufficiently remove the contaminant that adheres to the bevel portion of the substrate. This causes the ratio of the substrates that are transported to the exposure device to be further increased, resulting in further improved yield.

(6) The substrate processing apparatus may further include an alarm generation device that generates an alarm in accordance with the control operation of the controller, the bevel portion inspection device may inspect the bevel portion of the substrate after the exposure processing by the exposure device, and the controller may control the alarm generation device so as to generate the alarm as the first control operation when the bevel portion inspection device determines that the bevel portion of the substrate is contaminated after the exposure processing.

In this case, when the exposure device is contaminated or is not normally operated, the bevel portion of the substrate may be contaminated during the exposure processing. By causing the alarm generation device to generate the alarm when it is determined that the bevel portion of the substrate after the exposure processing is contaminated, therefore, an operator can be made to recognize the timing of maintaining the exposure device.

(7) The processing section may include a film formation unit that subjects the substrate before the exposure processing by the exposure device to film formation processing, the bevel portion inspection device may inspect the bevel portion of the substrate before the film formation processing by the film formation unit, and the controller may control the processing section such that the substrate is not subjected to the film formation processing by the film formation unit as the first control operation when the bevel portion inspection device determines that the bevel portion of the substrate is contaminated before the film formation processing.

In this case, the film formation unit subjects the substrate whose bevel portion is clean to the film formation processing. This can prevent defective film formation processing caused by the contamination of the bevel portion of the substrate.

(8) The substrate processing apparatus may further include a transport device that transports the substrate between the processing section and a plurality of storing containers in accordance with the control operation of the controller, in which the processing section may include a development processing unit that subjects the substrate after the exposure processing by the exposure device to development processing, the bevel portion inspection device may inspect the bevel portion of the substrate after the development processing by the development processing unit, and the controller may control the transport device such that the substrate is stored in one of the plurality of storing containers as the first control operation when the bevel portion inspection device determines that the bevel portion of the substrate is contaminated after the development processing, while controlling the transport device such that the substrate is stored in the other one of the plurality of storing containers as the second control operation when the bevel portion inspection device determines that the bevel portion is not contaminated.

In this case, the substrate whose bevel portion has been contaminated and the substrate whose bevel portion is clean are respectively stored in the separate storing containers, which can prevent the substrate whose bevel portion has been contaminated from being fed as it is to the subsequent processing process.

(9) According to another aspect of the present invention, a substrate processing apparatus that is arranged adjacent to an exposure device may include a processing section having a processing unit that subjects a substrate to processing, an interface provided adjacent to one end of the processing section for receiving and transferring the substrate between the processing section and the exposure device, and a controller that controls the respective operations of the processing section and the interface, in which the processing unit has an end portion inspection device that inspects the state of an end portion of the substrate after the substrate is subjected to predetermined processing, and the controller determines whether or not the end portion of the substrate is in a good state on the basis of the results of the inspection by the end portion inspection device, to perform a first control operation when the end portion of the substrate is in the good state, while performing a second control operation when the end portion of the substrate is in a not-good state.

In the substrate processing apparatus, the processing unit subjects the substrate to the predetermined processing in the processing section, and the interface receives and transfers the substrate from the processing section to the exposure device. After the exposure device subjects the substrate to the exposure processing, the interface returns the substrate after the exposure processing from the exposure device to the processing section. The controller controls the respective operations of the processing section and the interface.

In the processing unit, the end portion inspection device inspects the state of the end portion of the substrate after the substrate is subjected to the predetermined processing. The controller determines whether or not the end portion of the substrate is in the good state on the basis of the results of the inspection. The controller performs the first control operation when the end portion of the substrate is in the good state, while performing the second control operation when the end portion of the substrate is in the not-good state.

Thus, the first control operation or the second control operation is selectively performed depending on the state of the end portion of the substrate after the processing in the processing unit, which can prevent defective processing of the substrate caused by the state of the end portion of the substrate.

(10) The processing unit may include a film formation processing unit that subjects the substrate before the exposure processing by the exposure device to film formation processing, the film formation processing unit may include a processing liquid supplier that supplies a processing liquid for the film formation processing onto the substrate, and a processing liquid remover that removes the processing liquid supplied onto the substrate by the processing liquid supplier, and the end portion inspection device may inspects the state of the end portion of the substrate after the processing liquid supplier supplies the processing liquid onto the substrate in the film formation processing unit.

In this case, in the film formation processing unit, the processing liquid supplier supplies the processing liquid onto the substrate, so that the substrate is subjected to the film formation processing. After the film formation processing, the end portion inspection device inspects the state of the end portion of the substrate.

The substrate can be suitably subjected to the film formation processing while keeping the end portion of the substrate clean by controlling the processing liquid supplier and the processing liquid remover depending on the state of the end portion of the substrate after the film formation processing.

(11) The controller may determine whether the processing liquid does not adhere to the end portion of the substrate as the good state or the processing liquid adheres to the end portion of the substrate as the not-good state on the basis of the results of the inspection by the end portion inspection device in the film formation processing unit, to control the processing liquid supplier and the processing liquid remover so as to remove the processing liquid supplied onto the substrate and supply the processing liquid onto the substrate again as the second control operation when the processing liquid adheres to the end portion of the substrate.

In this case, if the processing liquid adheres to the end portion of the substrate after the film formation processing, the processing liquid remover removes the processing liquid on the substrate once, and the processing liquid supplier then subjects the substrate to the film formation processing again. This prevents the substrate from being transported from the film formation processing unit to the exposure device with the processing liquid adhering to the end portion. Therefore, the exposure device is prevented from being contaminated by the processing liquid that adheres to the end portion of the substrate, to prevent a defective dimension and a defective shape of an exposure pattern.

(12) The controller may determine whether the processing liquid does not adhere to the end portion of the substrate as the good state or the processing liquid adheres to the end portion of the substrate as the not-good state on the basis of the results of the inspection by the end portion inspection device in the film formation processing unit, to control the processing liquid remover so as to remove the processing liquid that adheres to the end portion of the substrate as the second control operation when the processing liquid adheres to the end portion of the substrate.

In this case, if the processing liquid adheres to the end portion of the substrate after the film formation processing, the processing liquid remover removes the processing liquid that adheres to the end portion of the substrate. This prevents the substrate from being transported from the film formation processing unit to the exposure device with the processing liquid adhering to the end portion. This prevents the exposure device from being contaminated by the processing liquid that adheres to the end portion of the substrate, to prevent a defective dimension and a defective shape of an exposure pattern.

(13) The film formation processing unit may include a photosensitive film formation unit that forms a photosensitive film on the substrate. In this case, the photosensitive film can be suitably formed on the substrate while keeping the end portion of the substrate clean.

(14) The film formation processing unit may further include an anti-reflection film formation unit that forms an anti-reflection film on the substrate before the photosensitive film formation unit forms the photosensitive film.

In this case, the anti-reflection film can be suitably formed on the substrate while keeping the end portion of the substrate clean. Furthermore, in the photosensitive film formation unit, the film formation processing can be performed with the end portion of the substrate kept clean, which allows the photosensitive film to be satisfactorily formed on the substrate.

(15) The film formation processing unit may further include a protective film formation unit that forms on the substrate a protective film for protecting the photosensitive film formed by the photosensitive film formation unit.

In this case, the protective film can be suitably formed on the substrate while keeping the end portion of the substrate clean. This allows the photosensitive film to be sufficiently protected, which can more sufficiently prevent defective processing of the substrate.

(16) The substrate processing apparatus may further include a transport device that transports the substrate between the processing section and a plurality of storing containers in accordance with the control operation of the controller, in which the processing unit may include a development processing unit that subjects the substrate after the exposure processing by the exposure device to development processing, the end portion inspection device may inspect the end portion of the substrate after the development processing by the development processing unit, and the controller may determine whether or not the end portion of the substrate is in the good state on the basis of the results of the inspection by the end portion inspection device after the development processing, to control the transport device such that the substrate is stored in one of the plurality of storing containers as the first control operation when the end portion of the substrate is in the good state, while controlling the transport device such that the substrate is stored in the other one of the plurality of storing containers as the second control operation when the end portion of the substrate is in the not-good state.

In this case, the substrate whose end portion is in the good state and the substrate whose end portion is in the not-good state are respectively stored in the separate storing containers, which can prevent the substrate whose end portion is in the not-good state from being fed as it is to the subsequent processing process.

Other features, elements, characteristics, and advantages of the present invention will become more apparent from the following description of preferred embodiments of the present invention with reference to the attached drawings.

BRIEF DESCRIPTION OF THE DRAWINGS

FIG. 6 is a diagram showing the details of a bevel portion of a substrate;

DETAILED DESCRIPTION OF THE INVENTION

Substrate processing apparatuses according to embodiments of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(A) FIRST EMBODIMENT (A-1) Configuration of Substrate Processing Apparatus

Figure 1:
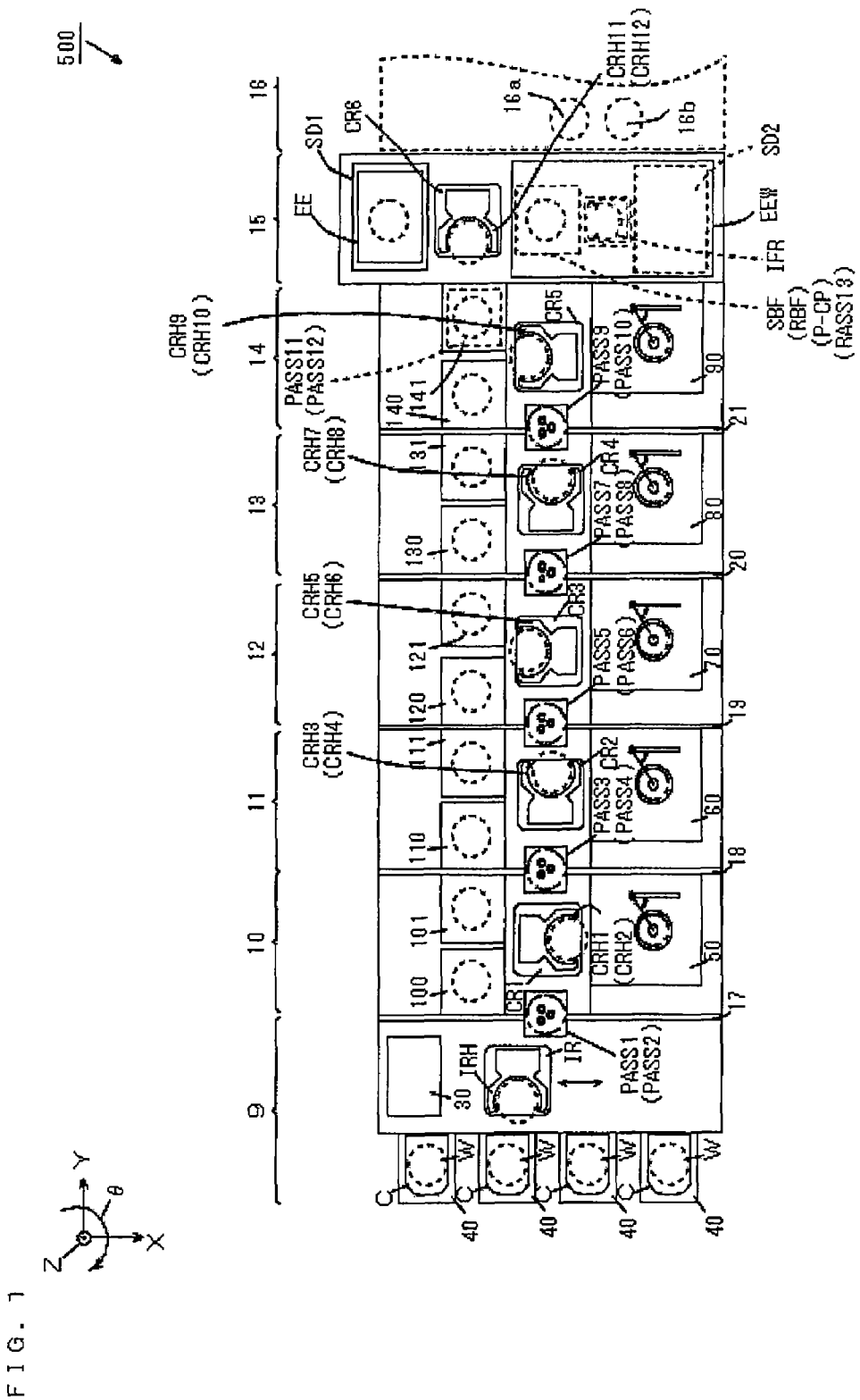
FIG. 1 is a plan view of a substrate processing apparatus according to a first embodiment of the present invention.

FIG. 1 is a plan view of a substrate processing apparatus according to a first embodiment of the present invention. FIG. 1 and FIGS. 2 to 4, 16 to 18, 20, and 22 to 24 described later are accompanied by arrows that respectively indicate X, Y, and Z directions perpendicular to one another for clarity of a positional relationship. The X and Y directions are perpendicular to each other within a horizontal plane, and the Z direction corresponds to the vertical direction. In each of the directions, the direction of the arrow is defined as a +direction, and the opposite direction is defined as a – direction. A rotation direction centered around the Z direction is defined as a θ direction.

As shown in FIG. 1, a substrate processing apparatus 500 includes an indexer block 9, an anti-reflection film processing block 10, a resist film processing block 11, a development processing block 12, a resist cover film processing block 13, a resist cover film removal block 14, and an interface block 15. An exposure device 16 is arranged adjacent to the interface block 15. The exposure device 16 subjects a substrate W to exposure processing by means of a liquid immersion method.

Each of the indexer block 9, the anti-reflection film processing block 10, the resist film processing block 11, the development processing block 12, the resist cover film processing block 13, the resist cover film removal block 14, and the interface block 15 will be hereafter referred to as a processing block.

The indexer block 9 includes a main controller (controller) 30 that controls the operation of each of the processing blocks, a plurality of carrier platforms 40, and an indexer robot IR. The indexer robot IR has a hand IRH provided for receiving and transferring the substrates W.

The anti-reflection film processing block 10 includes thermal processing groups 100 and 101 for anti-reflection film, a coating processing group 50 for anti-reflection film, and a first central robot CR1. The coating processing group 50 is opposed to the thermal processing groups 100 and 101 with the first central robot CR1 sandwiched therebetween. The first central robot CR1 has hands CRH1 and CRH2 provided one above the other for receiving and transferring the substrates W.

A partition wall 17 is provided between the indexer block 9 and the anti-reflection film processing block 10 for shielding an atmosphere. The partition wall 17 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not shown) for detecting the presence or absence of the substrate W. This allows determination whether or not the substrate W is placed on the substrate platform PASS1 or PASS2. Furthermore, each of the substrate platforms PASS1 and PASS2 has a plurality of support pins secured thereto. Note that each of substrate platforms PASS3 to PASS13 and PASS15 to PASS26 described later is similarly provided with an optical sensor and support pins.

The resist film processing block 11 includes thermal processing groups 110 and 111 for resist film, a coating processing group 60 for resist film, and a second central robot CR2. The coating processing group 60 is opposed to the thermal processing groups 110 and 111 with the second central robot CR2 sandwiched therebetween. The second central robot CR2 has hands CRH3 and CRH4 provided one above the other for receiving and transferring the substrates W.

A partition wall 18 is provided between the anti-reflection film processing block 10 and the resist film processing block 11 for shielding an atmosphere. The partition wall 18 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 includes thermal processing groups 120 and 121 for development, a development processing group 70, and a third central robot CR3. The development processing group 70 is opposed to the thermal processing groups 120 and 121 with the third central robot CR3 sandwiched therebetween. The third central robot CR3 has hands CRH5 and CRH6 provided one above the other for receiving and transferring the substrates W.

A partition wall 19 is provided between the resist film processing block 11 and the development processing block 12 for shielding an atmosphere. The partition wall 19 has substrate platforms PASS5 and PASS6 provided in close proximity one above the other for receiving and transferring the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 includes thermal processing groups 130 and 131 for resist cover film, a coating processing group 80 for resist cover film, and a fourth central robot CR4. The coating processing group 80 is opposed to the thermal processing groups 130 and 131 with the fourth central robot CR4 sandwiched therebetween. The fourth central robot CR4 has hands CRH7 and CRH8 provided one above the other for receiving and transferring the substrates W.

A partition wall 20 is provided between the development processing block 12 and the resist cover film processing block 13 for shielding an atmosphere. The partition wall 20 has substrate platforms PASS7 and PASS8 provided in close proximity one above the other for receiving and transferring the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 includes thermal processing groups 140 and 141 for post-exposure bake, a removal processing group 90 for resist cover film, and a fifth central robot CR5. The thermal processing group 141 is adjacent to the interface block 15, and includes substrate platforms PASS11 and PASS12, as described later. The removal processing group 90 is opposed to the thermal processing groups 140 and 141 with the fifth central robot CR5 sandwiched therebetween. The fifth central robot CR5 has hands CRH9 and CRH10 provided one above the other for receiving and transferring the substrates W.

A partition wall 21 is provided between the resist cover film processing block 13 and the resist cover film removal block 14 for shielding an atmosphere. The partition wall 21 has substrate platforms PASS9 and PASS10 provided in close proximity one above the other for receiving and transferring the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The interface block 15 includes a bevel portion inspection unit EE, first cleaning/drying processing units SD1, a sixth central robot CR6, an edge exposure unit EEW, a return buffer unit RBF, placement/cooling units PASS-CP (hereinafter abbreviated as P-CP), a substrate platform PASS13, an interface transport mechanism IFR, and second cleaning/drying processing units SD2. The first cleaning/drying processing unit SD1 subjects the substrate W before exposure processing to cleaning and drying processing, and the second cleaning/drying processing SD2 subjects the substrate W after exposure processing to cleaning and drying processing. The details of the first and second cleaning/drying processing units SD1 and SD2 will be described later.

The sixth central robot CR6 has hands CRH11 and CRH12 (see FIG. 4) provided one above the other for receiving and transferring the substrates W, and the interface transport mechanism IFR has hands H1 and H2 (see FIG. 4) provided one above the other for receiving and transferring the substrates W. The details of the interface block 15 will be described later.

In the substrate processing apparatus 500 according to the present embodiment, the indexer block 9, the anti-reflection film processing block 10, the resist film processing block 11, the development processing block 12, the resist cover film processing block 13, the resist cover film removal block 14, and the interface block 15 are provided side by side in this order in the Y direction.

Figure 2:
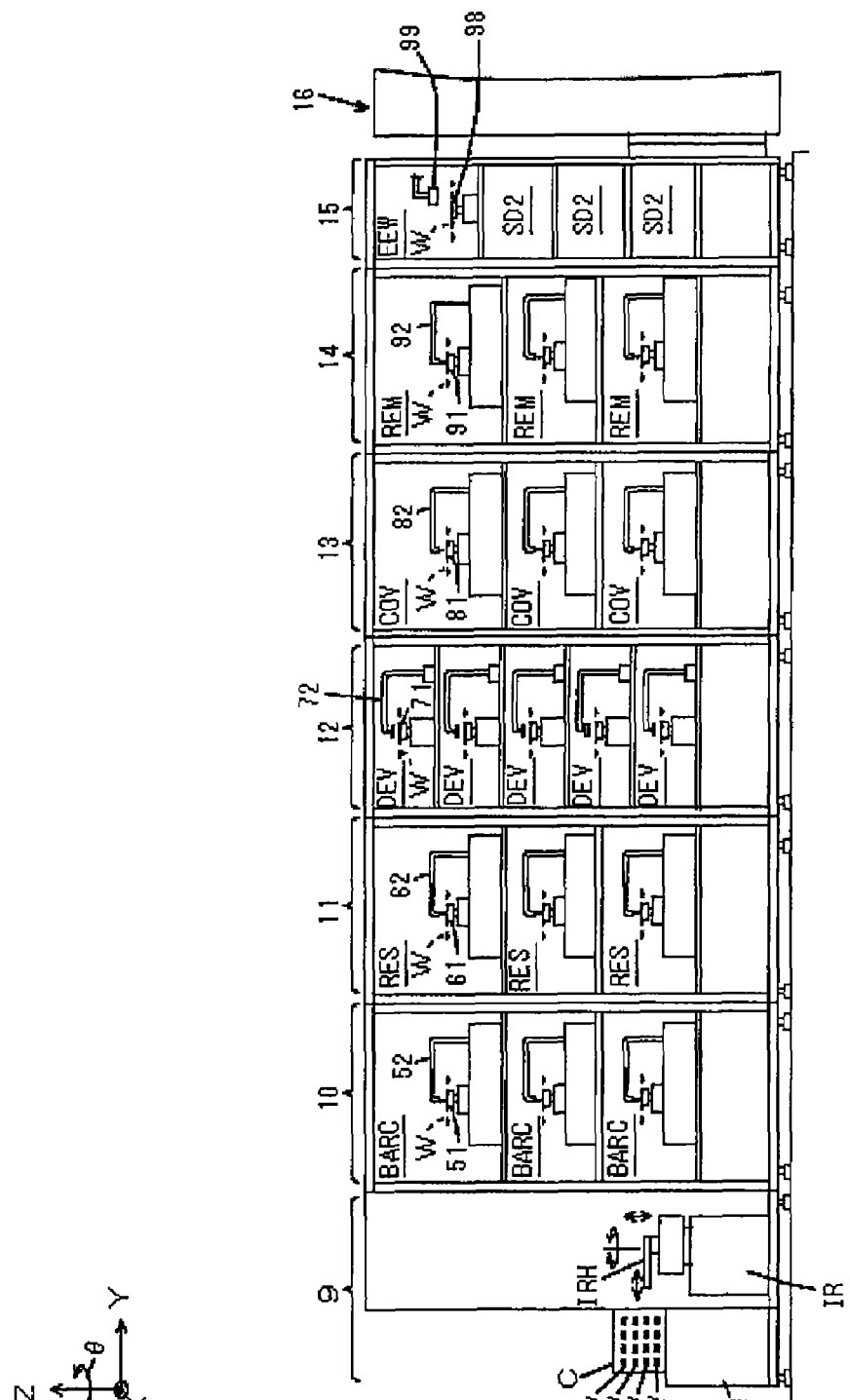
FIG. 2 is a schematic side view of the substrate processing apparatus shown in FIG. 1 as viewed from the +X direction.
Figure 3:
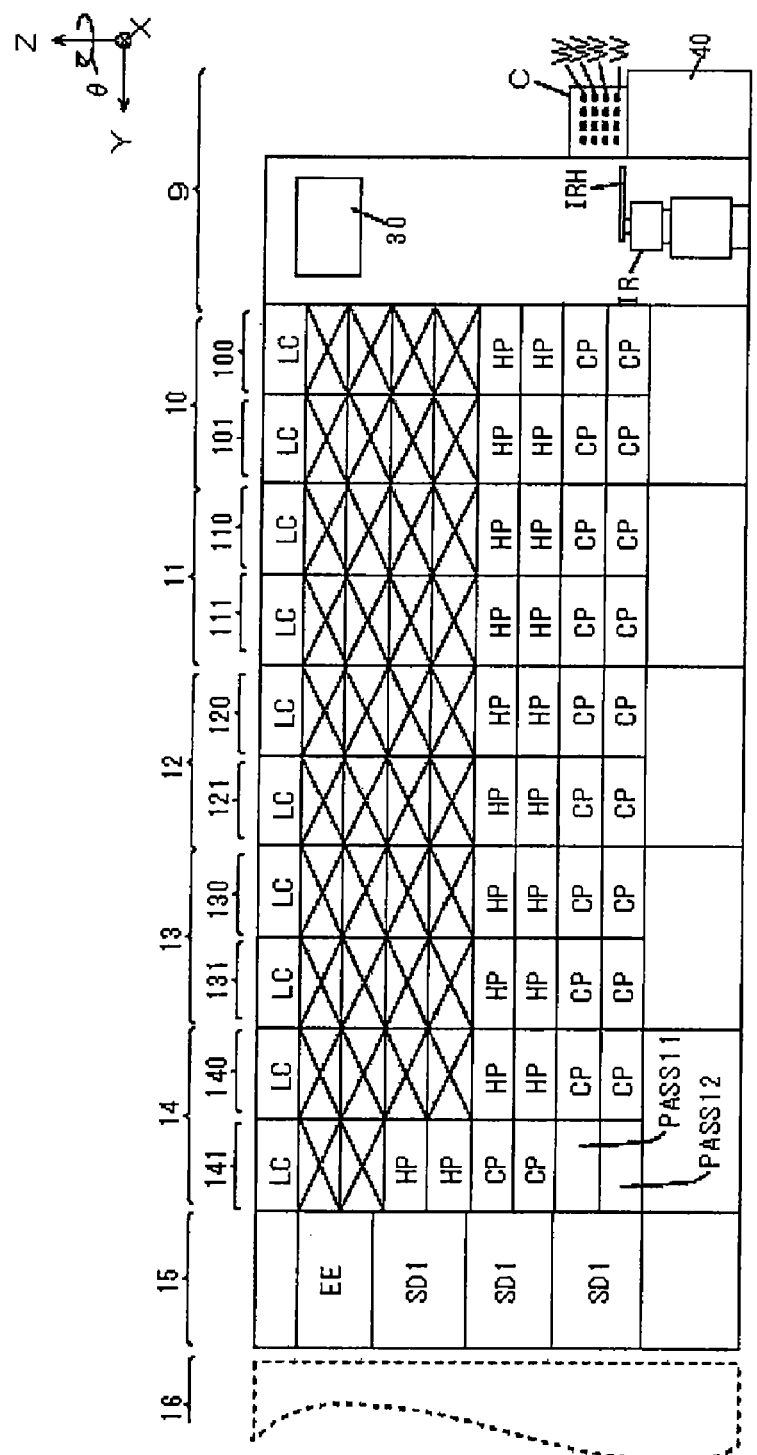
FIG. 3 is a schematic side view of the substrate processing apparatus shown in FIG. 1 as viewed from the –X direction.

FIG. 2 is a schematic side view of the substrate processing apparatus 500 shown in FIG. 1 as viewed from the +X direction, and FIG. 3 is a schematic side view of the substrate processing apparatus 500 shown in FIG. 1 as viewed from the −X direction. FIG. 2 mainly shows the configuration on the +X side of the substrate processing apparatus 500, and FIG. 3 mainly shows the configuration on the −X side of the substrate processing apparatus 500.

Description is first made of the configuration on the +X side of the substrate processing apparatus 500 using FIG. 2. As shown in FIG. 2, the coating processing group 50 in the anti-reflection film processing block 10 (see FIG. 1) has a vertical stack of three coating units BARC. Each of the coating units BARC includes a spin chuck 51 for rotating the substrate W with the substrate W held in a horizontal attitude by suction, and a supply nozzle 52 for supplying a coating liquid for an anti-reflection film to the substrate W held on the spin chuck 51.

The coating processing group 60 in the resist film processing block 11 (see FIG. 1) has a vertical stack of three coating units RES. Each of the coating units RES includes a spin chuck 61 for rotating the substrate W with the substrate W held in a horizontal attitude by suction, and a supply nozzle 62 for supplying a coating liquid for a resist film to the substrate W held on the spin chuck 61.

The development processing group 70 in the development processing block 12 has a vertical stack of five development processing units DEV. Each of the development processing units DEV includes a spin chuck 71 for rotating the substrate W with the substrate W held in a horizontal attitude by suction, and a supply nozzle 72 for supplying a development liquid to the substrate W held on the spin chuck 71.

The coating processing group 80 in the resist cover film processing block 13 has a vertical stack of three coating units COV. Each of the coating units COV includes a spin chuck 81 for rotating the substrate W with the substrate W held in a horizontal attitude by suction, and a supply nozzle 82 for supplying a coating liquid for a resist cover film to the substrate W held on the spin chuck 81. Materials having a low affinity for resists and water (materials having low reactivity to resists and water) can be used as the coating liquid for the resist cover film. An example of the coating liquid is fluororesin. Each of the coating units COV forms the resist cover film on the resist film formed on the substrate W by applying the coating liquid onto the substrate W while rotating the substrate W.

The removal processing group 90 in the resist cover film removal block 14 has a vertical stack of three removal units REM. Each of the removal units REM includes a spin chuck 91 for rotating the substrate W with the substrate W held in a horizontal attitude by suction, and a supply nozzle 92 for supplying a stripping liquid (e.g., fluororesin) to the substrate W held on the spin chuck 91. Each of the removal units REM removes the resist cover film formed on the substrate W by applying the stripping liquid onto the substrate W while rotating the substrate W.

Note that a method of removing the resist cover films in the removal units REM is not limited to the above-mentioned examples. For example, the resist cover film may be removed by supplying the stripping liquid onto the substrate W while moving a slit nozzle above the substrate W.

The interface block 15 has a vertical stack of an edge exposure unit EEW and three second cleaning/drying processing units SD2 on the +X side. The edge exposure unit EEW includes a spin chuck 98 for rotating the substrate W with the substrate held in a horizontal attitude by suction, and a light irradiator 99 for exposing a peripheral portion of the substrate W held on the spin chuck 98.

Description is now made of the configuration on the –X side of the substrate processing apparatus 500 using FIG. 3. As shown in FIG. 3, each of the thermal processing groups 100 and 101 in the anti-reflection film processing block 10 has a stack of two heating units (hot plates) HP and two cooling units (cooling plates) CP. Each of the thermal processing groups 100 and 101 has a local controller LC for controlling the respective temperatures of the heating units HP and the cooling units CP arranged in its uppermost part.

Each of the thermal processing groups 110 and 111 in the resist film processing block 11 has a stack of two heating units HP and two cooling units CP. Each of the thermal processing groups 110 and 111 also has a local controller LC for controlling the respective temperatures of the heating units HP and the cooling units CP arranged in its uppermost part.

Each of the thermal processing groups 120 and 121 in the development processing block 12 has a stack of two heating units HP and two cooling units CP. Each of the thermal processing groups 120 and 121 also has a local controller LC for controlling the respective temperatures of the heating units HP and the cooling units CP arranged in its uppermost part.

Each of the thermal processing groups 130 and 131 in the resist cover film processing block 13 has a stack of two heating units HP and two cooling units CP. Each of the thermal processing groups 130 and 131 also has a local controller LC for controlling the respective temperatures of the heating units HP and the cooling units CP arranged in its uppermost part.

In the resist cover film removal block 14, the thermal processing group 140 has a vertical stack of two heating units HP and two cooling units CP, and the thermal processing group 141 has a vertical stack of two heating units HP, two cooling units CP, and substrate platforms PASS11 and PASS12. Each of the thermal processing groups 140 and 141 has a local controller LC for controlling the respective temperatures of the heating units HP and the cooling units CP arranged in its uppermost part.

Figure 4:
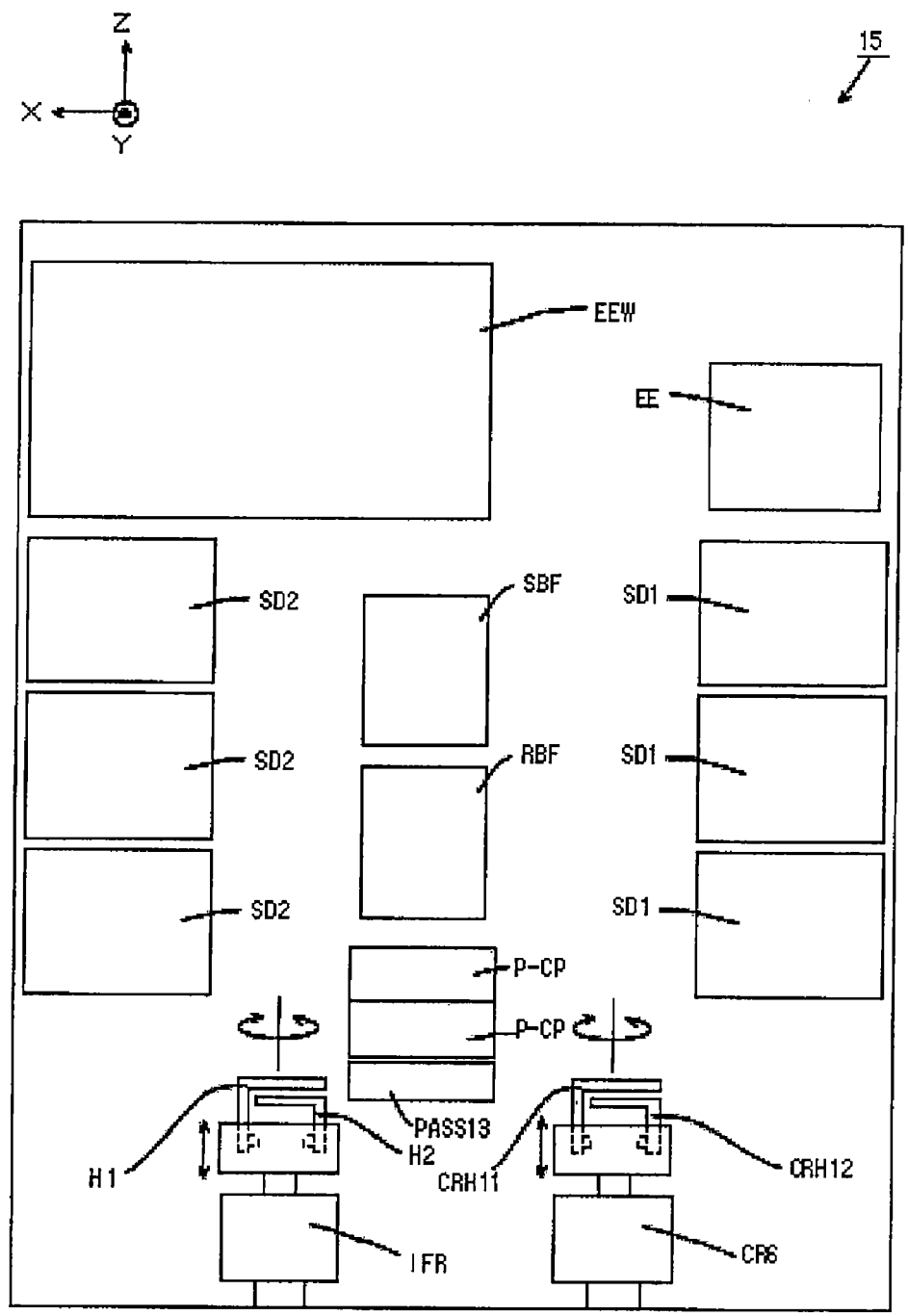
FIG. 4 is a schematic side view of an interface block as viewed from the +Y side.

The interface block 15 will be then described in detail using FIG. 4.

FIG. 4 is a schematic side view of the interface block 15 as viewed from the +Y side. As shown in FIG. 4, the interface block 15 has a stack of the bevel portion inspection unit EE and the three first cleaning/drying processing units SD1 on the –X side. The interface block 15 has an edge exposure unit EEW arranged on the +X side in its upper part.

The interface block 15 has a vertical stack of a sending buffer unit SBF, a return buffer unit RBF, two placement/cooling units P-CP, and a substrate platform PASS13 at its substantially central portion below the edge exposure unit EEW. The interface block 15 has a vertical stack of three second cleaning/drying processing units SD2 arranged on the +X side below the edge exposure unit EEW.

A sixth central robot CR6 and an interface transport mechanism IFR are provided in a lower part of the interface block 15. The sixth central robot CR6 is provided so as to be vertically movable and rotatable in an area among the bevel portion inspection unit EE, the first cleaning/drying processing units SD1, the edge exposure unit EEW, the sending buffer unit SBF, the return buffer unit RBF, the placement/cooling units P-CP, and the substrate platform PASS13. The interface transport mechanism IFR is provided so as to be vertically movable and rotatable in an area among the placement/cooling units P-CP, the substrate platform PASS13, and the second cleaning/drying processing units SD2.

(A-2) Operation of Substrate Processing Apparatus

The operation of the substrate processing apparatus 500 according to the present embodiment will be then described with reference to FIGS. 1 to 4.

(A-2-1) Operations of Indexer Block to Resist Cover Film Removal Block

First, the operations of the indexer block 9 to the resist cover film removal block 14 will be briefly described.

Carriers C that store a plurality of substrates W in multiple stages are respectively carried onto the carrier platforms 40 in the indexer block 9. The indexer robot IR takes out the unprocessed substrate W that is stored in the carrier C using the hand IRH. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, OCs (Open Cassettes) that expose the stored substrates W to outside air, and so on may be used.

Furthermore, although linear-type transport robots that move their hands forward or backward by linearly sliding them to the substrate W are respectively used as the indexer robot IR, the first to sixth central robots CR1 to CR6, and the interface transport mechanism IFR, the present invention is not limited to the same. For example, multi-joint type transport robots that linearly move their hands forward and backward by moving their joints may be used.

The unprocessed substrate W placed on the substrate platform PASS1 is received by the first central robot CR1 in the anti-reflection film processing block 10. The first central robot CR1 carries the substrate W into the thermal processing group 100 or 101.

Thereafter, the first central robot CR1 takes out the thermally processed substrate W from the thermal processing group 100 or 101 and carries the substrate W into the coating processing group 50. In the coating processing group 50, the coating unit BARC forms a coating of an anti-reflection film on the substrate W in order to reduce standing waves and halation generated during the exposure processing.

The first central robot CR1 then takes out the substrate W after the coating processing from the coating processing group 50 and carries the substrate W into the thermal processing group 100 or 101. Thereafter, the first central robot CR1 takes out the thermally processed substrate W from the thermal processing group 100 or 101 and places the substrate W on the substrate platform PASS3.

The substrate W placed on the substrate platform PASS3 is received by the second central robot CR2 in the resist film processing block 11. The second central robot CR2 carries the substrate W into the thermal processing group 110 or 110.

Thereafter, the second central robot CR2 takes out the thermally processed substrate W from the thermal processing group 110 or 111 and carries the substrate W into the coating processing group 60. In the coating processing group 60, the coating unit RES forms a coating of a resist film on the substrate W that has been coated with the anti-reflection film.

The second central robot CR2 then takes out the substrate W after the coating processing from the coating processing group 60 and carries the substrate W into the thermal processing group 110 or 111. Thereafter, the second central robot CR2 takes out the thermally processed substrate W from the thermal processing group 110 or 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the resist cover film processing block 13. The fourth central robot CR4 carries the substrate W into the coating processing group 80. In the coating processing group 80, the coating unit COV forms a coating of a resist cover film on the substrate W that has been coated with the resist film.

The fourth central robot CR4 then takes out the substrate W after the coating processing from the coating processing group 80 and carries the substrate W into the thermal processing group 130 or 131. Thereafter, the fourth central robot CR4 takes out the thermally processed substrate W from the thermal processing group 130 or 131 and places the substrate W on the substrate platform PASS9.

The substrate W placed on the substrate platform PASS9 is received by the fifth central robot CR5 in the resist cover film removal block 14. The fifth central robot CR5 places the substrate W on the substrate platform PASS11.

The substrate W placed on the substrate platform PASS11 is received by the sixth central robot CR6 in the interface block 15, and is subjected to predetermined processing in the interface block 15 and the exposure device 16, as described later. After the substrate W is subjected to the predetermined processing in the interface block 15 and the exposure device 16, the sixth central robot CR6 carries the substrate W into the thermal processing group 141 in the resist cover film removal block 14.

In the thermal processing group 141, the substrate W is subjected to post-exposure bake (PEB). Thereafter, the sixth central robot CR6 takes out the substrate W from the thermal processing group 141 and places the substrate W on the substrate platform PASS12.

Although the substrate W is subjected to the post-exposure bake in the thermal processing group 141 in the present embodiment, the substrate W may be subjected to post-exposure bake in the thermal processing group 140.

The substrate W placed on the substrate platform PASS12 is received by the fifth central robot CR5 in the resist cover film removal block 14. The fifth central robot CR5 carries the substrate W into the removal processing group 90. In the removal processing group 90, the removal unit REM removes the resist cover film on the substrate W.

The fifth central robot CR5 then takes out the processed substrate W from the removal processing group 90 and places the substrate W on the substrate platform PASS10.

The substrate W placed on the substrate platform PASS10 is placed on the substrate platform PASS8 by the fourth central robot CR4 in the resist cover film processing block 13.

The substrate W placed on the substrate platform PASS8 is received by the third central robot CR3 in the development processing block 12. The third central robot CR3 carries the substrate W into the development processing group 70. In the development processing group 70, the exposed substrate W is subjected to development processing.

The third central robot CR3 then takes out the substrate W after the development processing from the development processing group 70 and carries the substrate W into the thermal processing group 120 or 121. Thereafter, the third central robot CR3 takes out the thermally processed substrate W from the thermal processing group 120 or 121 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(A-2-2) Operation of Interface Block

The operation of the interface block 15 will be then described.

As described in the foregoing, the substrate W carried into the indexer block 9 is subjected to predetermined processing, and is then placed on the substrate platform PASS11 in the resist cover film removal block 14 (FIG. 1).

The substrate W placed on the substrate platform PASS11 is received by the sixth central robot CR6 in the interface block 15. The sixth central robot CR6 carries the substrate W into the edge exposure unit EEW (FIG. 4). In the edge exposure unit EEW, a peripheral portion of the substrate W is subjected to exposure processing.

The sixth central robot CR6 then takes out the substrate W after the exposure processing from the edge exposure unit EEW and carries the substrate W into any one of the first cleaning/drying processing units SD1. In the first cleaning/drying processing unit SD1, the substrate W before the exposure processing is subjected to cleaning and drying processing, as described above.

The sixth central robot CR6 then takes out the substrate W after the cleaning and drying processing from the first cleaning/drying processing unit SD1 and carries the substrate W into the bevel portion inspection unit EE. The bevel portion inspection unit EE inspects a bevel portion of the substrate W, to determine whether or not the bevel portion of the substrate W is contaminated.

Specifically, laser light is irradiated onto the bevel portion of the substrate W, and its scattered light is detected, for example. When the intensity of the detected scattered light is within a predetermined range, it is determined that the bevel portion of the substrate W is not contaminated. When the intensity of the detected scattered light deviates from the predetermined range, it is determined that the bevel portion of the substrate W is contaminated. Note that a method of inspecting the bevel portion of the substrate W is not limited to the same. For example, the bevel portion of the substrate W may be imaged by a CCD (Charge Coupled Device) camera or the like to determine whether or not the bevel portion of the substrate W is contaminated on the basis of an image obtained by the imaging.

The results of the determination made by the bevel portion inspection unit EE are given to the main controller 30. The main controller 30 controls each of the processing blocks such that the substrate W whose bevel portion is determined contaminated and the substrate W whose bevel portion is determined that it is not contaminated are respectively subjected to different types of processing.

The substrate W whose bevel portion is determined to be contaminated is taken out of the bevel portion inspection unit EE by the sixth central robot CR6, and is then carried into the sending buffer unit SBF. The substrate W is recovered by an operator after lot completion, and is separately subjected to processing. Note that a buffer for storing the substrate W whose bevel portion is determined to be contaminated may be provided separately from the sending buffer unit SBF.

Description is now made of the operation of the interface block 15 for the substrate W whose bevel portion is determined that it is not contaminated.

A time period for the exposure processing by the exposure device 16 is ordinarily longer than those for other processing and transporting processes. As a result, the exposure device 16 cannot accept the subsequent substrates W in many cases. In this case, the substrate W is temporarily stored in the sending buffer unit SBF. In the present embodiment, the sixth central robot CR6 takes out the substrate W after the cleaning and drying processing from the first cleaning/drying processing unit SD1 and transports the substrate W to the sending buffer unit SBF.

The sixth central robot CR6 then takes out the substrate W stored in the sending buffer unit SBF and carries the substrate W into the placement/cooling unit P-CP. The substrate W carried into the placement/cooling unit P-CP is kept at the same temperature as that in the exposure device 16 (for example, 23° C.).

In a case where the exposure device 16 has a sufficient processing speed, the substrate W need not be stored in the sending buffer unit SBF but may be transported to the placement/cooling unit P-CP from the first cleaning/drying processing unit SD1.

The substrate W kept at the above-mentioned predetermined temperature in the placement/cooling unit P-CP is then received with the upper hand H1 of the interface transport mechanism IFR (FIG. 4) and carried into a substrate inlet 16a in the exposure device 16 (FIG. 1).

The substrate W that has been subjected to the exposure processing in the exposure device 16 is carried out of a substrate outlet 16b (FIG. 1) with the lower hand H2 of the interface transport mechanism IFR (FIG. 4). The interface transport mechanism IFR carries the substrate W into any one of the second cleaning/drying processing units SD2 with the hand H2. In the second cleaning/drying processing unit SD2, the substrate W after the exposure processing is subjected to cleaning and drying processing, as described above.

The substrate W that has been subjected to the cleaning and drying processing in the second cleaning/drying processing unit SD2 is taken out with the hand H1 of the interface transport mechanism IFR (FIG. 4). The interface transport mechanism IFR places the substrate W on the substrate platform PASS13 with the hand H1.

The substrate W placed on the substrate platform PASS13 is received by the sixth central robot CR6. The sixth central robot CR6 transports the substrate W to the thermal processing group 141 in the resist cover film removal block 14 (FIG. 1).

Note that when the resist cover film removal block 14 cannot temporarily receive the substrate W due to a failure or the like in the removal unit REM (FIG. 2), the substrate W after the exposure processing can be temporarily stored in the return buffer unit RBF.

(A-3) Effect of the First Embodiment

In the first embodiment, the substrate W whose bevel portion is determined to be contaminated in the bevel portion inspection unit EE is not carried into the exposure device 16. This prevents contamination in the exposure device 16 due to contamination of the bevel portion of the substrate W. As a result, a defective dimension and a defective shape of an exposure pattern can be prevented.

(A-4) Another Example of Operation (A-4-1)

The substrate W whose bevel portion is determined to be contaminated in the bevel portion inspection unit EE may be returned to the indexer block 9 by the first to sixth central robots CR1 to CR6. In this case, the substrate W whose bevel portion has been contaminated is not subjected to exposure processing and development processing. Note that in the indexer block 9, the substrate W that has been subjected to the exposure processing and the development processing and the substrate W that is returned without being subjected to the exposure processing and the development processing are respectively stored in the separate carriers C.

(A-4-2)

The substrate W whose bevel portion is determined to be contaminated in the bevel portion inspection unit EE may be carried into the first cleaning/drying unit SD1 again. In this case, the substrate W that has been subjected to the cleaning and drying processing in the first cleaning/drying unit SD1 is carried into the bevel portion inspection unit EE again, to inspect whether or not the bevel portion is contaminated. That is, the substrate W is repeatedly subjected to cleaning processing in the first cleaning/drying unit SD1 until the bevel portion inspection unit EE determines that the bevel portion is not contaminated. This allows the substrate W to be carried into the exposure device 16 with the bevel portion kept clean.

(A-4-3)

The bevel portion inspection unit EE may inspect the bevel portion of the substrate W immediately after exposure processing in addition to the inspection of the bevel portion of the substrate W before exposure processing.

Only the substrate W whose bevel portion is clean is carried into the exposure device 16. If the exposure device 16 is normally operated in a clean state, the bevel portion of the substrate W immediately after exposure processing is clean. On the other hand, if the exposure device 16 is contaminated or is not normally operated, the bevel portion of the substrate W may be contaminated during exposure processing.

When it is determined in the bevel portion inspection unit EE that the bevel portion of the substrate W immediately after exposure processing is contaminated, an alarm generation device such as an alarm buzzer or an alarm lamp generates an alarm. Correspondingly, an operator stops the operation of the substrate processing apparatus 500, to maintain the exposure device 16.

By thus inspecting the bevel portion of the substrate W immediately before the substrate W is carried into the exposure device 16 and immediately after the substrate W is carried out of the exposure device 16, the timing of maintenance of the exposure device 16 can be quickly recognized.

Note that even when the bevel portion inspection unit EE determines that the bevel portion of the substrate W is not contaminated after the exposure processing, an alarm may be issued to an operator, as in the foregoing, if the degree of contamination detected in the bevel portion inspection unit EE before the exposure processing and the degree of contamination detected in the bevel portion inspection unit EE after the exposure processing differ from each other.

Note that a bevel portion inspection unit that inspects the bevel portion of the substrate W before the exposure processing and a bevel portion inspection unit that inspects the bevel portion of the substrate W after the exposure processing may be separately provided.

(A-5) Specific Example of First Cleaning/Drying Unit SD1

The first cleaning/drying processing unit SD1 may be provided with a bevel portion cleaning function for cleaning the bevel portion of the substrate W. In the case, the ratio of the substrates W whose bevel portions are determined to be contaminated in the bevel portion inspection unit EE is reduced. Therefore, the ratio of the substrates W that can be carried into the exposure device 16 is increased, resulting in improved yield.

Figure 5:
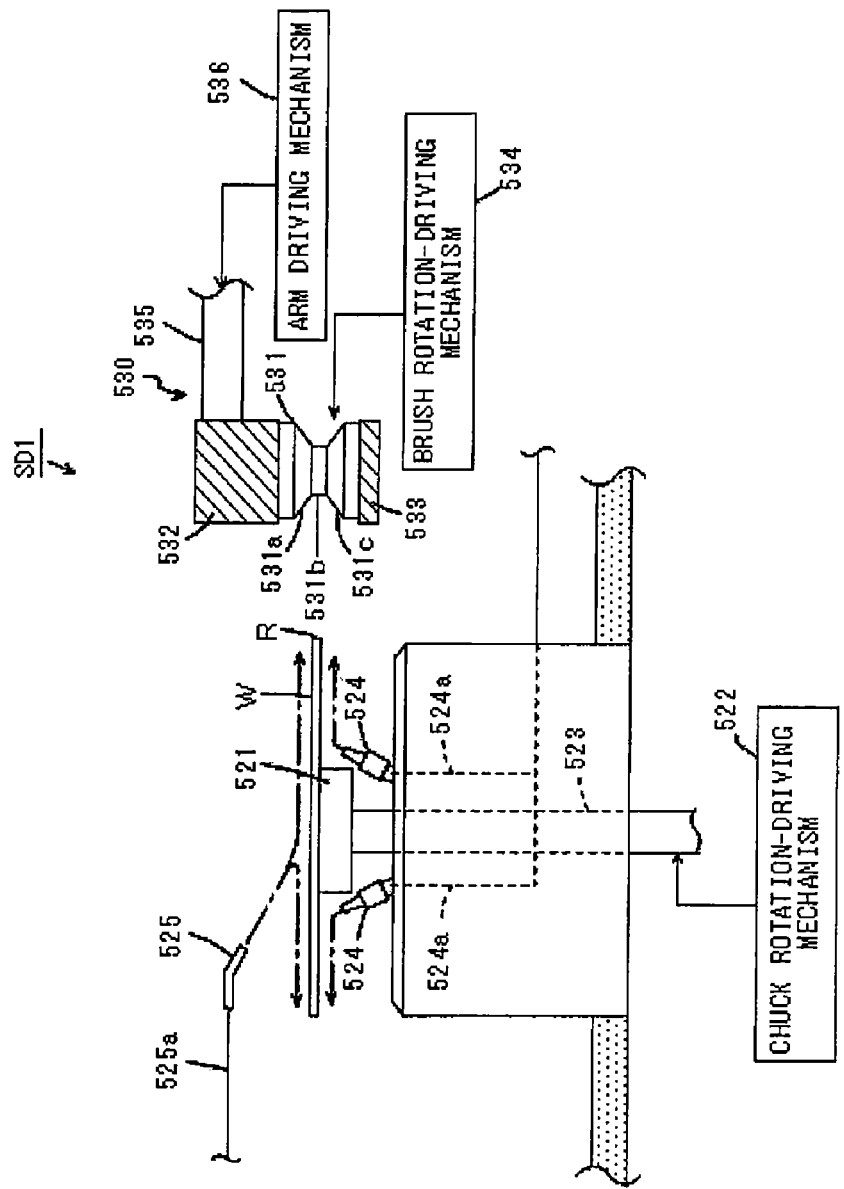
FIG. 5 is a diagram for explaining the configuration of a first cleaning/drying processing unit.

The first cleaning/drying processing unit SD1 with the bevel portion cleaning function will be described below. FIG. 5 is a diagram for explaining the configuration of the first cleaning/drying processing unit SD1. As shown in FIG. 5, the first cleaning/drying processing unit SD1 includes a spin chuck 521 for keeping the substrate W horizontal while rotating the substrate W around its vertical axis passing through the center of the substrate W.

The spin chuck 521 is secured to an upper end of a rotating shaft 523 that is rotated by a chuck rotation-driving mechanism 523. Furthermore, a suction path (not shown) is formed in the spin chuck 521. By evacuating the suction path with the substrate W placed on the spin chuck 521 to adsorb a lower surface of the substrate W to the spin chuck 521 under vacuum, the substrate W can be held in a horizontal attitude.

A plurality of (two in this example) lower surface nozzles 524 directed outwardly upward are provided in the vicinity of the spin chuck 521. Furthermore, an upper surface nozzle 525 directed obliquely downward are provided above the spin chuck 521. A cleaning liquid supply pipe 524a is connected to each of the lower surface nozzles 524, and a cleaning liquid supply pipe 525a is connected to the upper surface nozzle 525. A cleaning liquid is supplied to the lower surface nozzle 524 and the upper surface nozzle 525, respectively, through the cleaning liquid supply pipes 524a and 525a. Usable as the cleaning liquid is pure water, a surface active agent, a solvent, or an alcohol chemical liquid such as IPA (isopropyl alcohol).

When the substrate W is subjected to cleaning processing, the substrate W is rotated with the substrate W held in the spin chuck 521. The cleaning liquid is supplied toward the lower surface of the substrate W to be rotated from the lower surface nozzle 524. Furthermore, the cleaning liquid is supplied toward an upper surface of the substrate W to be rotated from the upper surface nozzle 525. The cleaning liquids respectively discharged from the lower surface nozzle 524 and the upper surface nozzle 525 expand outward by a centrifugal force. This causes respective peripheral regions of a top surface and a back surface of the substrate W to be cleaned.

A bevel cleaner 530 is arranged outside the spin chuck 521. The bevel cleaner 530 includes a cleaning brush 531. The cleaning brush 531 is held so as to be rotatable around its vertical axis by holding members 532 and 533, and is driven to rotate by a brush rotation-driving mechanism 534.

An arm 535 is connected to the holding member 532. An arm driving mechanism 536 moves the arm 535 in the vertical direction and the horizontal direction. As the arm driving mechanism 536 moves the arm 535, the cleaning brush 531 moves in the vertical direction and the horizontal direction.

The cleaning brush 531 has a shape that is rotationally-symmetric to the vertical axis, and has an upper bevel cleaning surface 531a, an end surface cleaning surface 531b, and a lower bevel cleaning surface 531c. The end surface cleaning surface 531b is a cylindrical surface having its axis in the vertical direction. The upper bevel cleaning surface 531a extends, inclined outwardly upward from an upper end of the end surface cleaning surface 531b, and the lower bevel cleaning surface 531c extends, inclined outwardly downward from a lower end of the end surface cleaning surface 531b.

When the substrate W is subjected to cleaning processing, the cleaning brush 531 in the bevel cleaner 530 cleans a bevel portion R of the substrate W.

Description is herein made of the bevel portion R of the substrate W. FIG. 6 is a diagram showing the details of the bevel portion R of the substrate W. As shown in FIG. 6, the bevel portion R includes an upper bevel region A inclined so as to continuously connect with a flat top surface of the substrate W, a lower bevel region C inclined so as to continuously connect with a flat back surface of the substrate W, and an end surface region B. Note that the top surface of the substrate W refers to a surface, on which various patterns such as a circuit pattern are formed, of the substrate W, and the back surface of the substrate W refers to a surface, on the opposite side thereof, of the substrate W.

An angle of inclination $\theta1$ of the upper bevel region A and an angle of inclination $\theta2$ of the lower bevel region C to a vertical plane are approximately equal to each other. Respective angles of inclination of the upper bevel cleaning surface 531a and the lower bevel cleaning surface 531c of the cleaning brush 531 shown in FIG. 5 to the vertical plane are respectively made approximately equal to the angles of inclination $\theta1$ and $\theta2$ of the upper bevel region A and the lower bevel region C in the substrate W.

When the substrate W is subjected to the cleaning processing, the cleaning brush 531 shown in FIG. 5 rotates by the brush rotation-driving mechanism 534 while moving toward the bevel portion R of the substrate W by the arm driving mechanism 536. Furthermore, the cleaning brush 531 moves in the vertical direction such that the upper bevel cleaning surface 531a, the end surface cleaning surface 531b, and the lower bevel cleaning surface 531c of the cleaning brush 531 respectively come into contact with the upper bevel region A, the end surface region B, and the lower bevel region C (FIG. 6) in the bevel portion R of the substrate W.

Note that the cleaning liquids respectively discharged from the lower surface nozzle 524 and the upper surface nozzle 525 are introduced into the bevel portion R along the back surface and the top surface of the substrate W by a centrifugal force caused by the rotation of the substrate W. That is, the cleaning liquid is supplied to a contact portion between the cleaning brush 531 and the bevel portion R of the substrate W.

Figure 7:
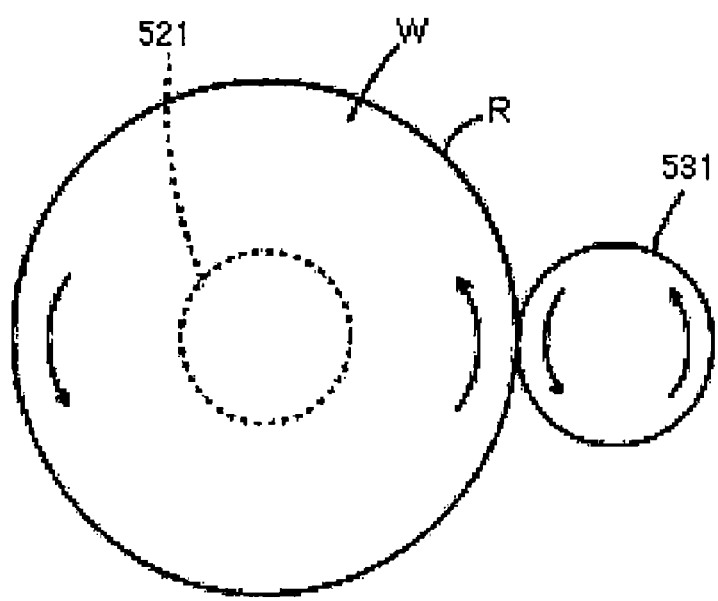
FIG. 7 is a plan view showing the respective rotation directions of a substrate and a cleaning brush.
Figure 8:
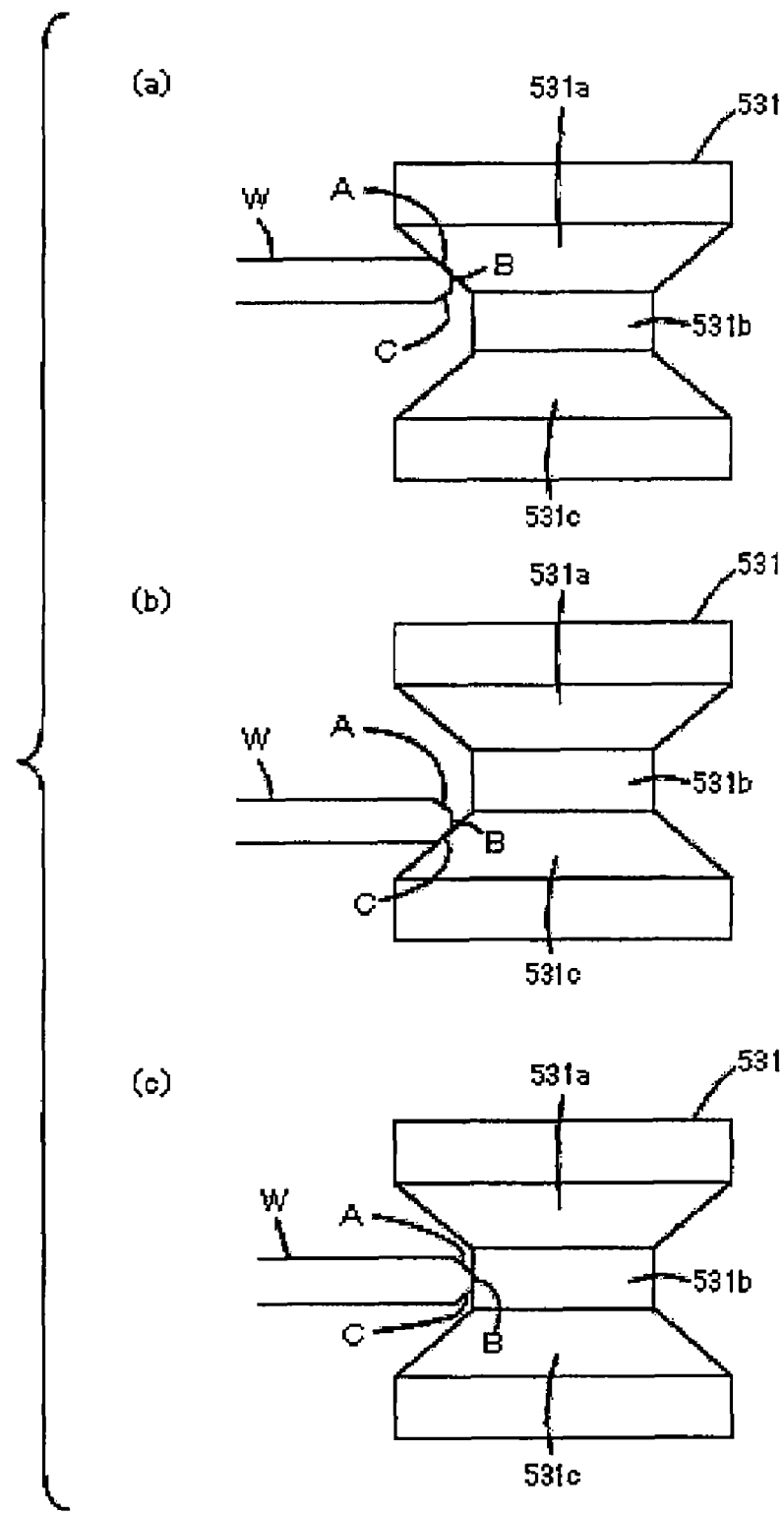
FIGS. 8(a) to 8(c) are diagrams showing a contact state between a substrate and a cleaning brush.

FIG. 7 is a plan view showing the respective rotation directions of the substrate W and the cleaning brush 531, and FIGS. 8(a) to 8(c) are diagrams showing a contact state between the substrate W and the cleaning brush 531.

As shown in FIG. 7, the cleaning brush 531 and the substrate W are rotated in the same direction. In this case, the relative rotational speed between the cleaning brush 531 and the substrate W is increased in the contact portion between the cleaning brush 531 and the substrate W. This causes the bevel portion R of the substrate W to be efficiently cleaned.

As shown in FIG. 8(a), the upper bevel cleaning surface 531a of the cleaning brush 531 comes into contact with the upper bevel region A in the substrate W, so that the upper bevel region A in the substrate W is cleaned. As described above, the angle of inclination of the upper bevel region A in the substrate W and the angle of inclination of the upper bevel cleaning surface 531a of the cleaning brush 531 are approximately equal to each other. Therefore, the upper bevel cleaning surface 531a of the cleaning brush 531 can be brought into contact with the whole area of the upper bevel region A in the substrate W. This allows the whole area of the upper bevel region A to be reliably cleaned.

Furthermore, as shown in FIG. 8(b), the lower bevel cleaning surface 531c of the cleaning brush 531 is brought into contact with the lower bevel region C in the substrate W, so that the lower bevel region C in the substrate W is cleaned. As described above, the angle of inclination of the lower bevel region C in the substrate W and the angle of inclination of the lower bevel cleaning surface 531c of the cleaning brush 531 are approximately equal to each other. Therefore, the lower bevel cleaning surface 531c of the cleaning brush 531 can be brought into contact with the whole area of the lower bevel region C in the substrate W. Therefore, the whole area of the lower bevel region C can be reliably cleaned.

Furthermore, as shown in FIG. 8(c), the end surface cleaning surface 531b of the cleaning brush 531 comes into contact with the end surface region B in the substrate W, so that the end surface region B in the substrate W is cleaned.

The whole area of the bevel portion R of the substrate W can be reliably cleaned by respectively bringing the upper bevel cleaning surface 531a, the end surface cleaning surface 531b, and the lower bevel cleaning surface 531c of the cleaning brush 531 into contact with the upper bevel region A, the end surface region B, and the lower bevel region C in the substrate W. This allows a contaminant that adheres to the bevel portion R of the substrate W to be reliably removed.

After the upper bevel region A, the end surface region B, and the lower bevel region C in the substrate W are cleaned, the cleaning brush 531 separates from the substrate W. Then, the rotational speed of the rotating shaft 553 (FIG. 5) rises, so that the cleaning liquid that adheres to the substrate W is scattered by a centrifugal force. This causes the substrate W to be dried. Note that an inert gas supply nozzle for spraying inert gas such as N2 (nitrogen) to the substrate W may be further provided in order to dry the substrate W efficiently and reliably.

(A-5-a) Another Example of Installation of the Cleaning Brush

Figure 9:
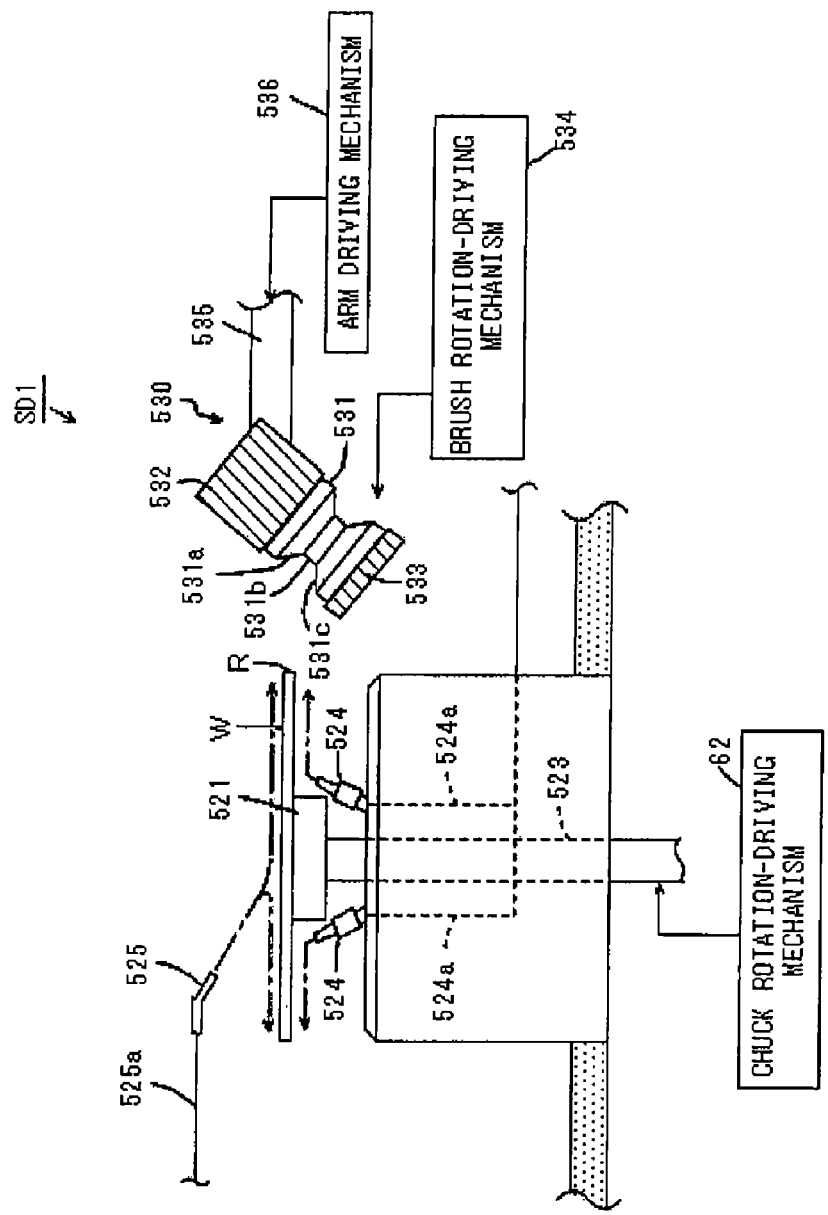
FIG. 9 is a diagram showing another example of installation of a cleaning brush.

FIG. 9 is a diagram showing another example of installation of the cleaning brush 531. In the first cleaning/drying processing unit SD1 shown in FIG. 9, the cleaning brush 531 is provided so as to be inclined to its vertical axis. The angle of inclination of the cleaning brush 531 is set such that the lower bevel cleaning surface 531c is parallel to a horizontal plane.

Figure 10:
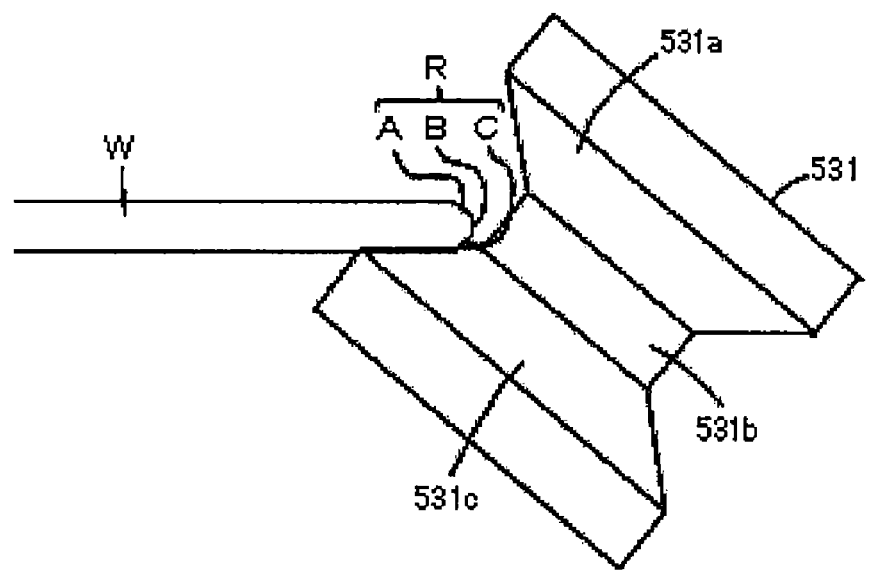
FIG. 10 is a diagram for explaining cleaning processing of a bevel portion of a substrate in a cleaning processing unit shown in FIG. 9.

FIG. 10 is a diagram for explaining cleaning processing of the bevel portion R of the substrate W in the first cleaning/drying processing unit SD1 shown in FIG. 9. As shown in FIG. 10, in the first cleaning/drying processing unit SD1, the lower bevel cleaning surface 531c of the cleaning brush 531 can clean a peripheral region on the lower surface of the substrate W. This allows a contaminant that adheres to the peripheral region on the lower surface of the substrate W to be reliably removed.

The lower bevel region C in the substrate W can be cleaned by bringing the end surface cleaning surface 531b of the cleaning brush 531 into contact with the lower bevel region C in the substrate W. Furthermore, the end surface region B in the substrate W can be cleaned by bringing the upper bevel cleaning surface 531a of the cleaning brush 531 into contact with the end surface region B in the substrate W.

Note that the angle of inclination of the cleaning brush 531 may be made optionally controllable. In the case, the upper bevel region A, the end surface region B, and the lower bevel region C in the bevel portion R of the substrate W can be cleaned with the cleaning brush 531 in an upright attitude, as shown in FIGS. 8(a) to 8(c). Furthermore, the peripheral region on the lower surface of the substrate W can be cleaned by inclining the cleaning brush 531 as shown in FIG. 10.

(A-5-b) Another Example of the Bevel Cleaner

Figure 11:
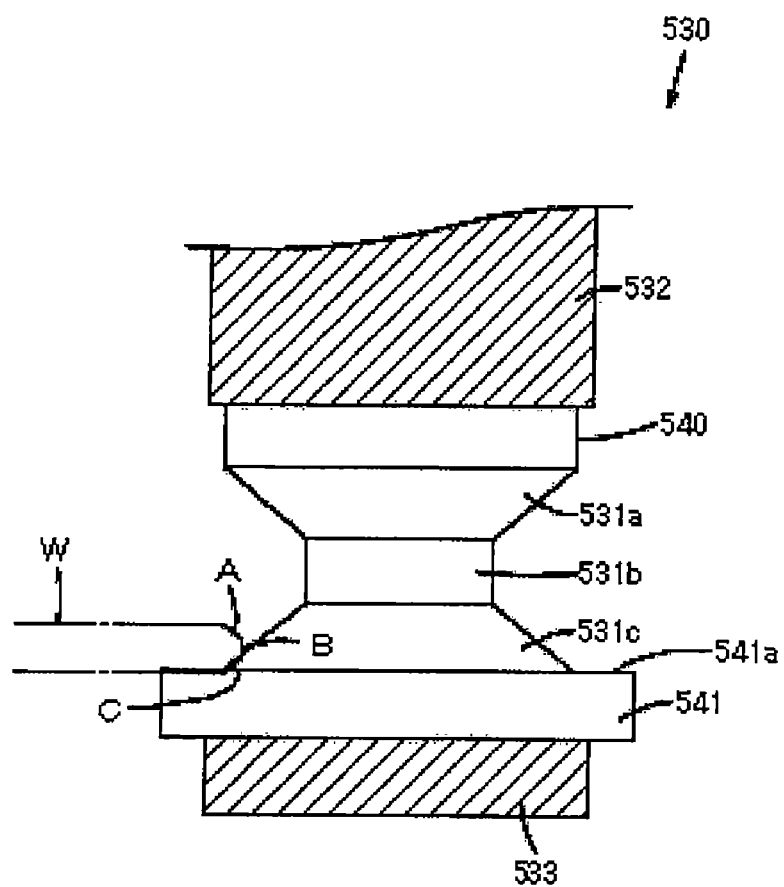
FIG. 11 is a diagram showing another example of a bevel cleaner.

FIG. 11 is a diagram showing another example of the bevel cleaner 530. A bevel cleaner 530 shown in FIG. 11 differs from the bevel cleaner 530 shown in FIG. 5 in that it includes a cleaning brush 540 in place of the cleaning brush 531.

The cleaning brush 540 differs from the cleaning brush 531 shown in FIG. 5 in the following points. A lower surface cleaner 541 is formed so as to project outward in a lower part of the cleaning brush 540. An upper surface 541a of the lower surface cleaner 541 (hereinafter referred to as a lower surface cleaning surface 541a) extends outward along a horizontal plane from a lower end of a lower bevel cleaning surface 531c.

When the cleaning brush 540 is used, a peripheral region on a back surface of a substrate W, in addition to an upper bevel region A, an end surface region B, and a lower bevel region C in the substrate W, can be cleaned by the lower surface cleaning surface 541a.

(A-5-c) Still Another Example of the Bevel Cleaner

Figure 12:
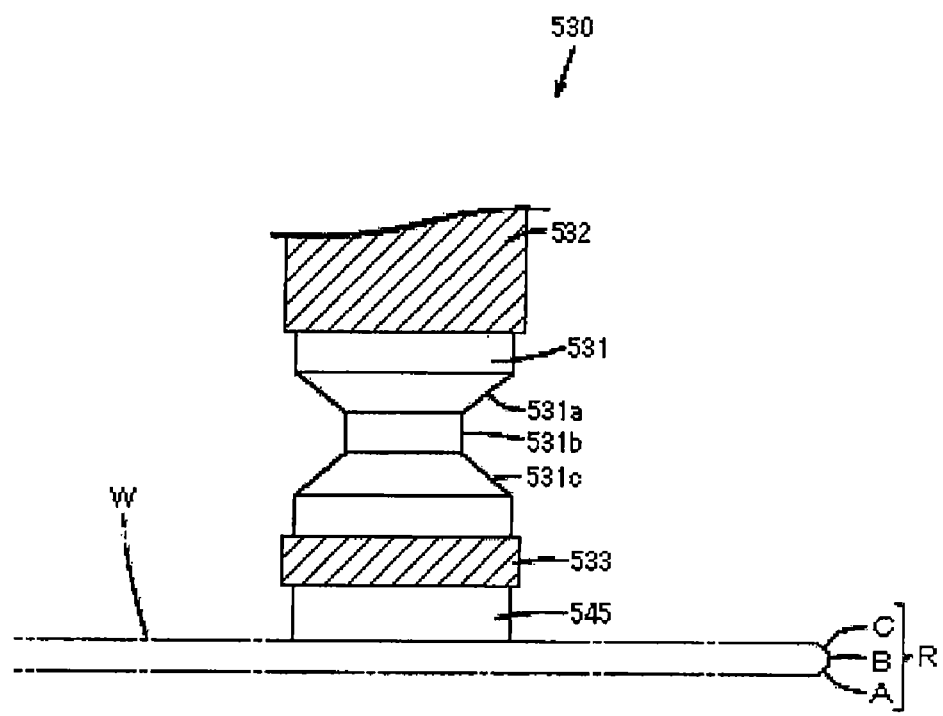
FIG. 12 is a diagram showing still another example of a bevel cleaner.

FIG. 12 is a diagram showing still another example of the bevel cleaner 530. In a bevel cleaner 530 shown in FIG. 12, a back surface cleaning brush 545 is attached to a lower surface of a holding member 533.

In the bevel cleaner 530, the whole area of a back surface of a substrate W, in addition to an upper bevel region A, an end surface region B, and a lower bevel region C in the substrate W, can be cleaned by the back surface cleaning brush 545. Specifically, the upper bevel region A, the end surface region B, and the lower bevel region C in the substrate W are first cleaned by a cleaning brush 531, as shown in FIGS. 8(a) to 8(c). After a cleaning liquid that adheres to the substrate W is scattered to dry the substrate W, a top surface and the back surface of the substrate W are reversed by a reversing robot (not shown). That is, the back surface of the substrate W is directed upward.

In the state, the substrate W is rotated while the cleaning liquid is supplied from the upper surface nozzle 525. The substrate W is scanned from its central portion to peripheral portion with the back surface cleaning brush 545 in the bevel cleaner 530 brought into contact with the back surface of the substrate W. Therefore, the back surface cleaning brush 545 cleans the whole area of the back surface of the substrate W, to more reliably remove a contaminant that adheres to the back surface of the substrate W.

Note that the back surface cleaning brush 545 may be driven to rotate integrally with the cleaning brush 531 by the brush rotation-driving mechanism 534. Although the back surface of the substrate W is cleaned after a bevel portion R of the substrate W is cleaned in this example, the bevel portion R of the substrate W may be cleaned after the back surface of the substrate W is cleaned.

When the bevel cleaner 530 shown in FIG. 12 is used, it is preferable that the spin chuck 521 of a vacuum suction type is replaced with a spin chuck that can rotate the substrate W by holding the bevel portion R of the substrate W in a plurality of holding pins and rotating each of the plurality of holding pins around its vertical axis, for example. In this case, the substrate W can be rotated with the back surface thereof directed upward without damaging a film formed on the top surface of the substrate W.

(A-5-d) Still Another Example of the Bevel Cleaner

Figure 13:
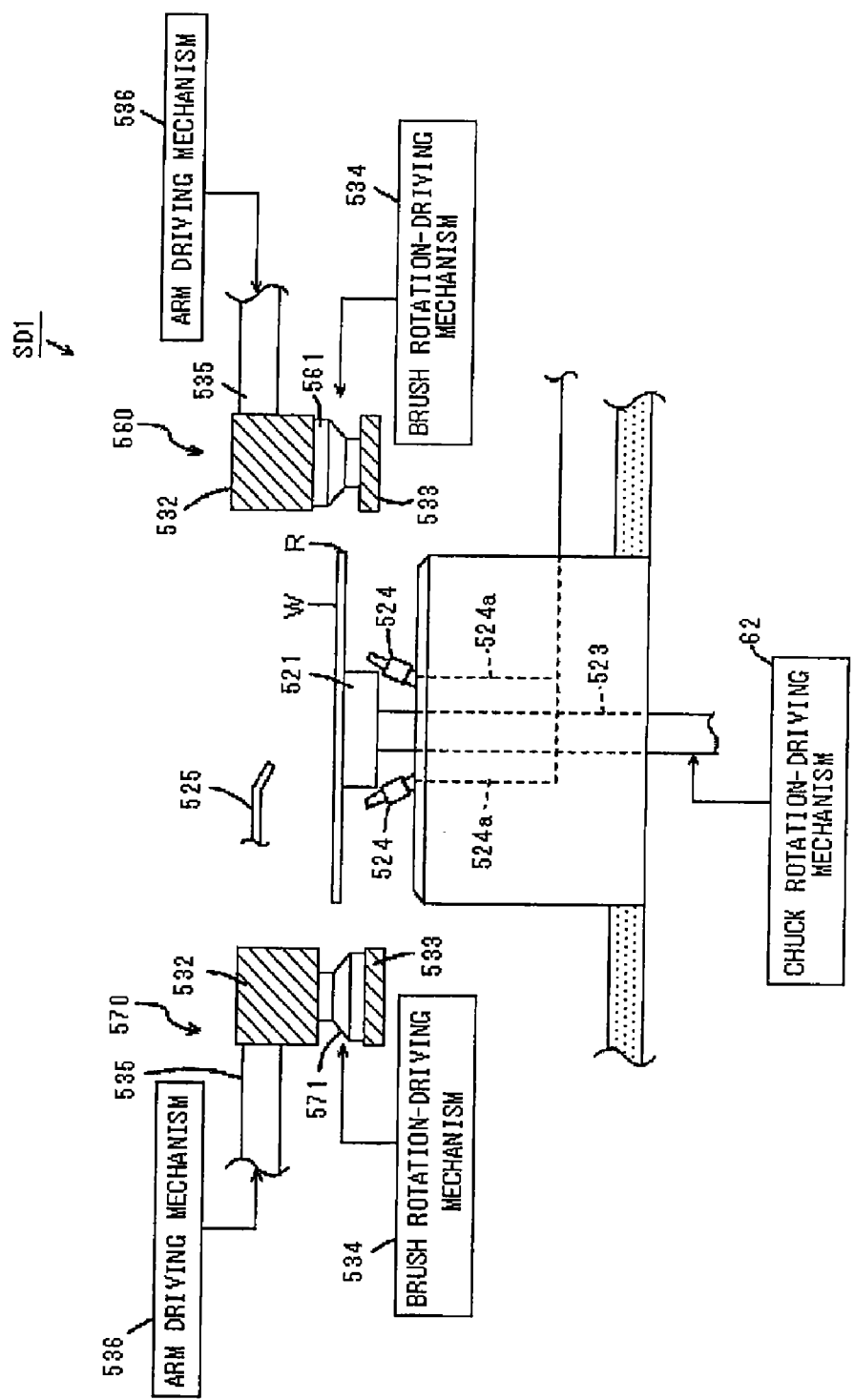
FIG. 13 is a diagram showing another example of a cleaning processing unit.

The bevel cleaner 530 may be replaced with bevel cleaners 560 and 570 shown in FIG. 13. FIG. 13 is a diagram showing a first cleaning/drying processing unit SD1 including the bevel cleaners 560 and 570.

As shown in FIG. 13, each of the bevel cleaners 560 and 570 includes holding members 532 and 533, a brush rotation-driving mechanism 534, an arm 535, and an arm driving mechanism 536, similarly to the bevel cleaner 530 shown in FIG. 5.

Figure 14:
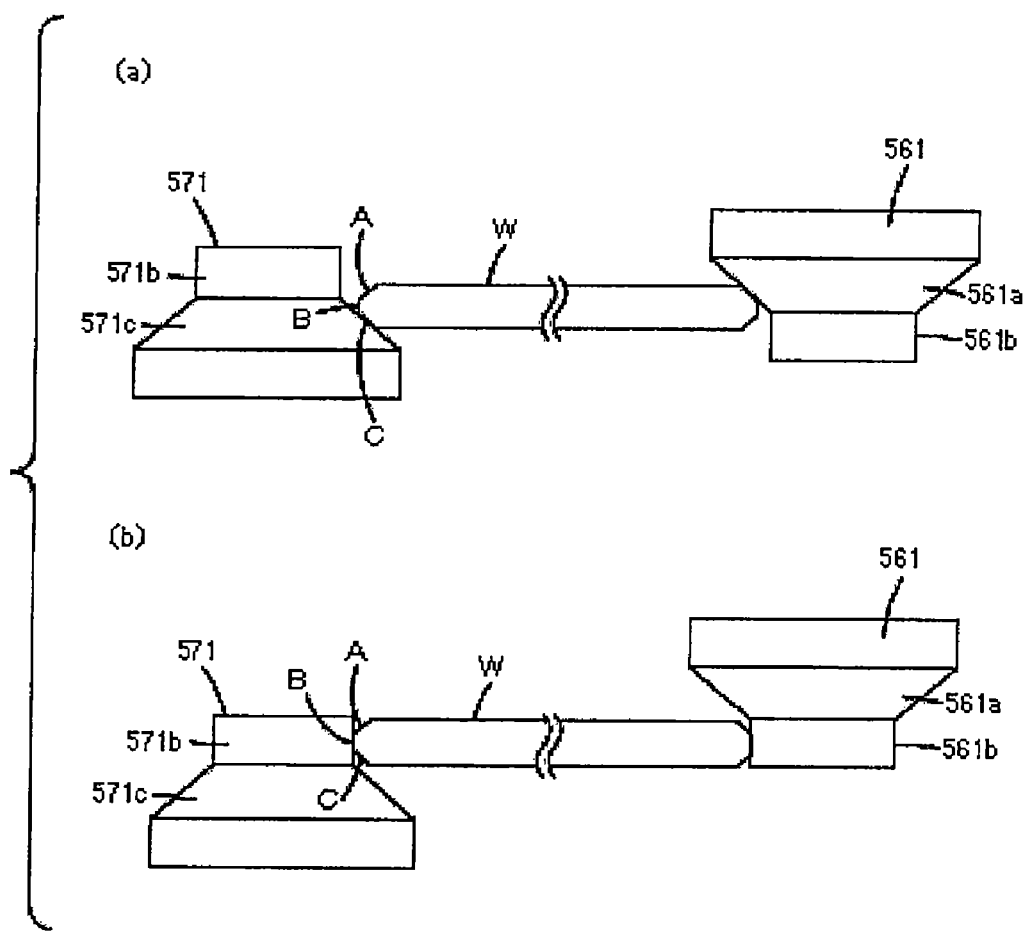
FIGS. 14(a) and 14(b) are diagrams for explaining cleaning processing of a bevel portion of a substrate using a cleaning brush in a bevel cleaner shown in FIG. 13.

The bevel cleaner 560 differs from the bevel cleaner 530 (FIG. 5) in that it includes a cleaning brush 561 in place of the cleaning brush 531. The cleaning brush 561 has an upper bevel cleaning surface 561a and an end surface cleaning surface 561b (FIG. 14) respectively corresponding to the upper bevel cleaning surface 531a and the end surface cleaning surface 531b of the cleaning brush 531.

The bevel cleaner 570 differs from the bevel cleaner 530 in that a cleaning brush 571 is provided in place of the cleaning brush 531. The cleaning brush 571 has an end surface cleaning surface 571b and a lower bevel cleaning surface 571c (FIG. 14) respectively corresponding to the end surface cleaning surface 531b and the lower bevel cleaning surface 531c of the cleaning brush 531.

When a substrate W is subjected to cleaning processing, the cleaning brushes 561 and 571 are respectively driven individually by the brush rotation-driving mechanism 534 and the arm driving mechanism 536.

Figure 15:
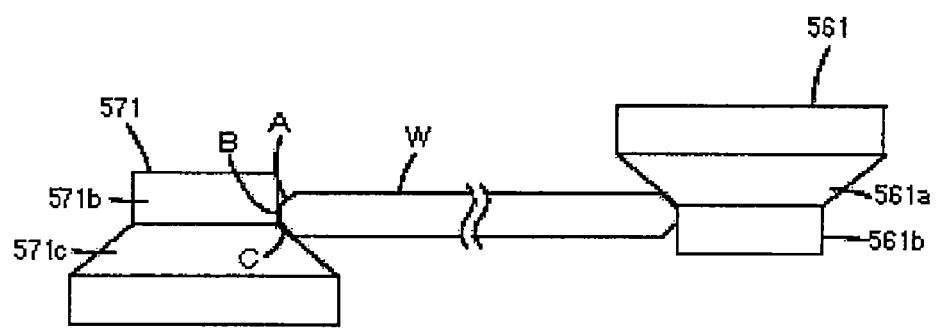
FIG. 15 is a diagram for explaining cleaning processing of a bevel portion of a substrate using a cleaning brush in a bevel cleaner shown in FIG. 13.

FIGS. 14(a), 14(b), and 15 are diagrams for explaining cleaning processing of a bevel portion R of the substrate W by the cleaning brushes 561 and 571 in the bevel cleaners 560 and 570. As shown in FIG. 14(a), the upper bevel cleaning surface 561a of the cleaning brush 561 comes into contact with an upper bevel region A in the substrate W, and the lower bevel cleaning surface 571c of the cleaning brush 571 comes into contact with a lower bevel region C in the substrate W, to clean the upper bevel region A and the lower bevel region C in the substrate W.

Furthermore, as shown in FIG. 14(b), the end surface cleaning surface 561b of the cleaning brush 561 and the end surface cleaning surface 571b of the cleaning brush 571 come into contact with an end surface region B in the substrate W, to clean the end surface region B in the substrate W.

When the bevel cleaners 560 and 570 are thus used, the upper bevel region A and the lower bevel region C in the substrate W can be simultaneously cleaned. Therefore, a cleaning time period can be shortened, as compared with that in a case where the upper bevel region A and the lower bevel region C in the substrate W are cleaned in this order.

As shown in FIG. 15, the upper bevel cleaning surface 561a of the cleaning brush 561, the lower bevel cleaning surface 571c of the cleaning brush 571, and the respective end surface cleaning surfaces 561b and 571b of the cleaning brushes 561 and 571 may be respectively brought into contact with the upper bevel region A, the end surface region B, and the lower bevel region C in the substrate W simultaneously. In this case, the upper bevel region A, the end surface region B, and the lower bevel region C in the substrate W can be simultaneously cleaned.

(B) SECOND EMBODIMENT

Figure 16:
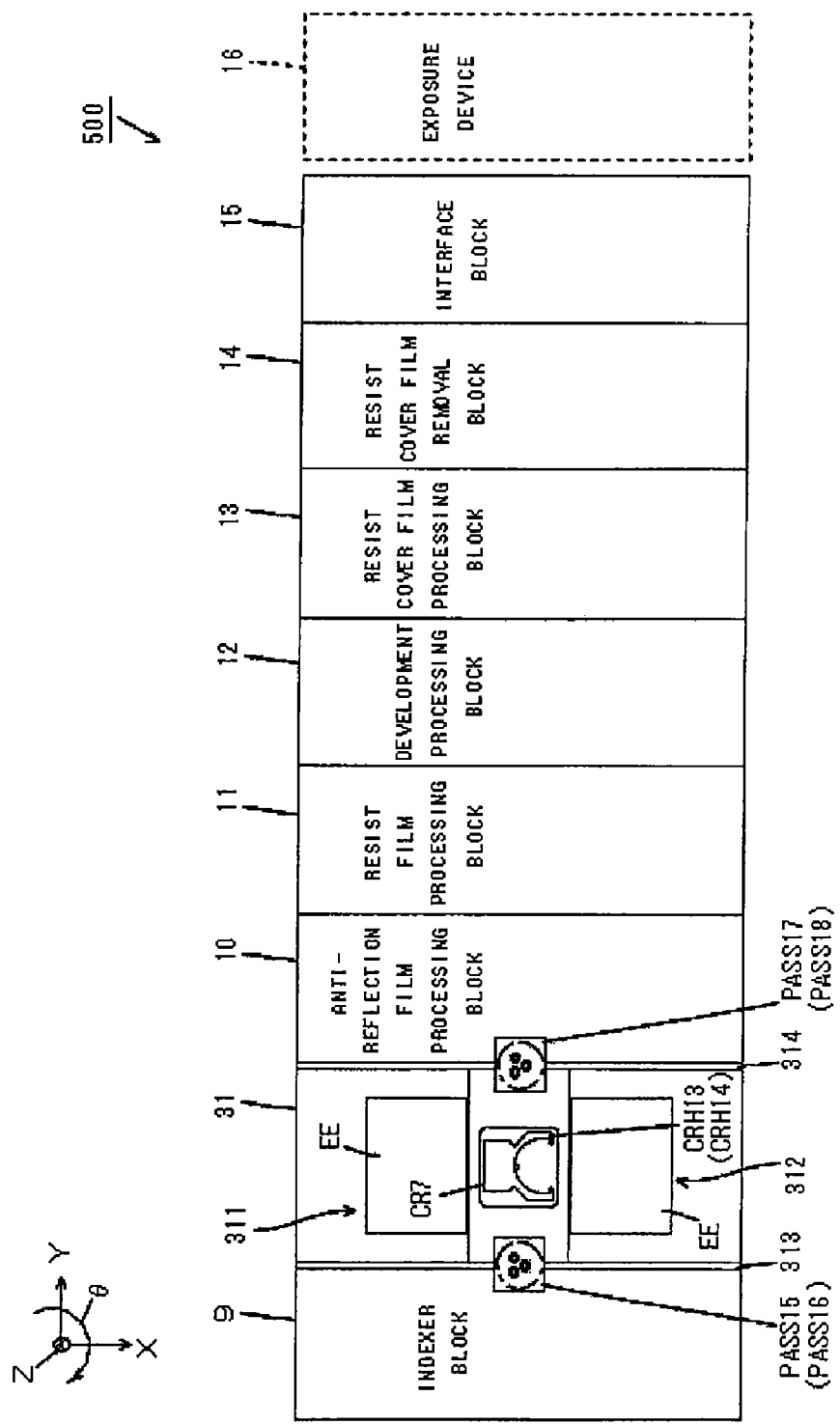
FIG. 16 is a plan view of a substrate processing apparatus according to a second embodiment.

As to a substrate processing apparatus 500 according to a second embodiment, the difference from the substrate processing apparatus 500 according to the first embodiment will be then described. FIG. 16 is a plan view of the substrate processing apparatus 500 according to the second embodiment. In FIG. 16, each of processing blocks is illustrated in simplified fashion.

As shown in FIG. 16, the substrate processing apparatus 500 according to the second embodiment includes a bevel portion inspection block 31 between an indexer block 9 and an anti-reflection film processing block 10. The bevel portion inspection block 31 includes a seventh central robot CR7 and bevel portion inspection groups 311 and 312.

The bevel portion inspection groups 311 and 312 are opposed to each other with the seventh central robot CR7 sandwiched therebetween. Each of the bevel portion inspection groups 311 and 312 has a vertical stack of a plurality of bevel portion inspection units EE. The seventh central robot CR7 has hands CRH13 and CRH14 provided one above the other for receiving and transferring substrates W.

A partition wall 313 is provided between the indexer block 9 and the bevel portion inspection block 31 for shielding an atmosphere, and a partition wall 314 is provided between the bevel portion inspection block 31 and the anti-reflection film processing block 10 for shielding an atmosphere. The partition wall 313 has substrate platforms PASS15 and PASS16 provided in close proximity one above the other for receiving and transferring the substrates W between the indexer block 9 and the bevel portion inspection block 31. The upper substrate platform PASS15 is used in transporting the substrates W from the indexer block 9 to the bevel portion inspection block 31, and the lower substrate platform PASS16 is used in transporting the substrates W from the bevel portion inspection block 31 to the indexer block 9.

The partition wall 314 has substrate platforms PASS17 and PASS18 provided in close proximity one above the other for receiving and transferring the substrates W between the bevel portion inspection block 31 and the anti-reflection film processing block 10. The upper substrate platform PASS17 is used in transporting the substrates W from the bevel portion inspection block 31 to the anti-reflection film processing block 10, and the lower substrate platform PASS18 is used in transporting the substrates W from the anti-reflection film processing block 10 to the bevel portion inspection block 31.

In the substrate processing apparatus 500, the unprocessed substrate W is transported from the indexer block 9 to the bevel portion inspection block 31. In the bevel portion inspection block 31, the bevel portion inspection unit EE inspects a bevel portion of the substrate W.

The substrate W whose bevel portion is determined to be contaminated as a result of the inspection by the bevel portion inspection unit EE is returned to the indexer block 9 by the seventh central robot CR7 and the indexer robot IR (FIG. 1), and is recovered in the carrier C (FIG. 1). The substrate W is carried into the indexer block 9 anew after the bevel portion is cleaned outside the substrate processing apparatus 500. The substrate whose bevel portion is determined to be contaminated may be recovered by an operator.

On the other hand, the substrate whose bevel portion is determined that it is not contaminated is transported to the anti-reflection film processing block 10. The substrate W is subjected to the same processing as described above in the anti-reflection film processing block 10, a resist film processing block 11, a development processing block 12, a resist cover film processing block 13, a resist cover film removal block 14, an interface block 15, and an exposure device 16.

The processed substrate W is returned to the bevel portion inspection block 31. The bevel portion inspection unit EE inspects the bevel portion again. Thereafter, the substrate W is returned to the indexer block 9, and is recovered in the carrier C. In this case, the substrate W whose bevel portion is determined to be contaminated and the substrate W whose bevel portion is determined that it is not contaminated as a result of the inspection by the bevel portion inspection unit EE are respectively recovered in the separate carriers C. After the substrate W whose bevel portion is determined to be contaminated is recovered in the carrier C, the bevel portion is cleaned outside the substrate processing apparatus 500.

In the present embodiment, the bevel portion inspection unit EE inspects the bevel portion of the unprocessed substrate W. Therefore, only the substrate W whose bevel portion is determined that it is not contaminated is transported to the anti-reflection film processing block 10. This allows the substrate W in each of the processing blocks to be satisfactorily processed.

Furthermore, the bevel portion of the substrate W is inspected by the bevel portion inspection unit EE immediately before being carried out of the substrate processing apparatus 500. Even when the bevel portion of the substrate W is contaminated during development processing in the development processing block 12, for example, therefore, contamination of the substrate W can be quickly recognized.

Note that the bevel portion inspection block 31 may be provided with a bevel portion cleaning unit with a bevel portion cleaning function. In this case, the bevel portion cleaning unit can clean the bevel portion of the unprocessed substrate W whose bevel portion is determined to be contaminated by the bevel portion inspection unit EE. This eliminates the necessity of recovering the substrate W once in the carrier C in order to clean the bevel portion thereof.

Furthermore, the bevel portion cleaning unit cleans the bevel portion of the processed substrate W whose bevel portion is determined to be contaminated by the bevel portion inspection unit EE. This allows the substrate W whose bevel portion has been contaminated during development processing or the like to be also carried out of the substrate processing apparatus 500 in a clean state.

Note that the same configuration as that of the first cleaning/drying processing unit SD1 shown in FIGS. 5 to 15, for example, can be used as the configuration of the bevel portion cleaning unit.

(C) THIRD EMBODIMENT

Figure 17:
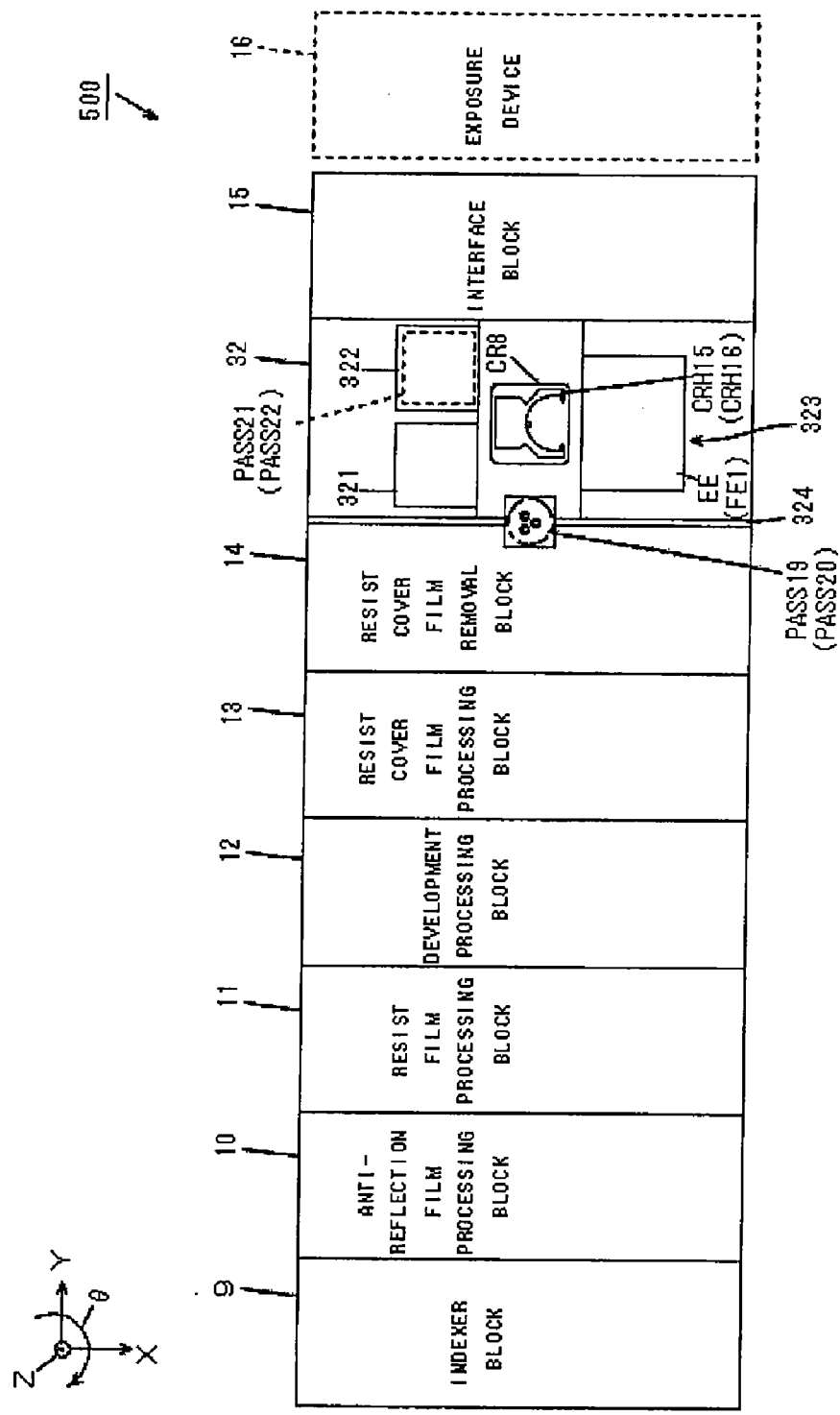
FIG. 17 is a plan view of a substrate processing apparatus according to a third embodiment.

As to a substrate processing apparatus 500 according to a third embodiment, the difference from the substrate processing apparatus 500 according to the first embodiment will be then described. FIG. 17 is a plan view of the substrate processing apparatus 500 according to the third embodiment. In FIG. 17, each of processing blocks is illustrated in simplified fashion.

As shown in FIG. 17, the substrate processing apparatus 500 according to the third embodiment includes an inspection block 32 between a resist cover film removal block 14 and an interface block 15. The inspection block 32 includes an eighth central robot CR8, thermal processing groups 321 and 322 for post-exposure bake, and a substrate inspection group 323.

The substrate inspection group 323 is opposed to the thermal processing groups 321 and 322 with the eighth central robot CR8 sandwiched therebetween. The substrate inspection group 323 has a vertical stack of a plurality of bevel portion inspection units EE and a plurality of film thickness inspection units FE1. The eighth central robot CR8 has hands CRH15 and CRH16 provided one above the other for receiving and transferring substrates W.

A partition wall 324 is provided between the resist cover film removal block 14 and the inspection block 32 for shielding an atmosphere. The partition wall 324 has substrate platforms PASS19 and PASS20 provided in close proximity one above the other for receiving and transferring the substrates W between the resist cover film removal block 14 and the inspection block 32. The upper substrate platform PASS19 is used in transporting the substrates W from the resist cover film removal block 14 to the inspection block 32, and the lower substrate platform PASS20 is used in transporting the substrates W from the inspection block 32 to the resist cover film removal block 14.

The thermal processing group 322 includes substrate platforms PASS21 and PASS22 for receiving and transferring the substrates W between the inspection block 32 and the interface block 15. The upper substrate platform PASS21 is used in transporting the substrates W from the inspection block 32 to the interface block 15, and the lower substrate platform PASS22 is used in transporting the substrates W from the interface block 15 to the inspection block 32.

In the inspection block 32, the bevel portion inspection unit EE inspects a bevel portion of the substrate W before or after exposure processing. Furthermore, the film thickness inspection unit FE1 inspects the respective thicknesses of an anti-reflection film, a resist film, and a resist cover film on the substrate W before exposure processing.

(D) FOURTH EMBODIMENT

Figure 18:
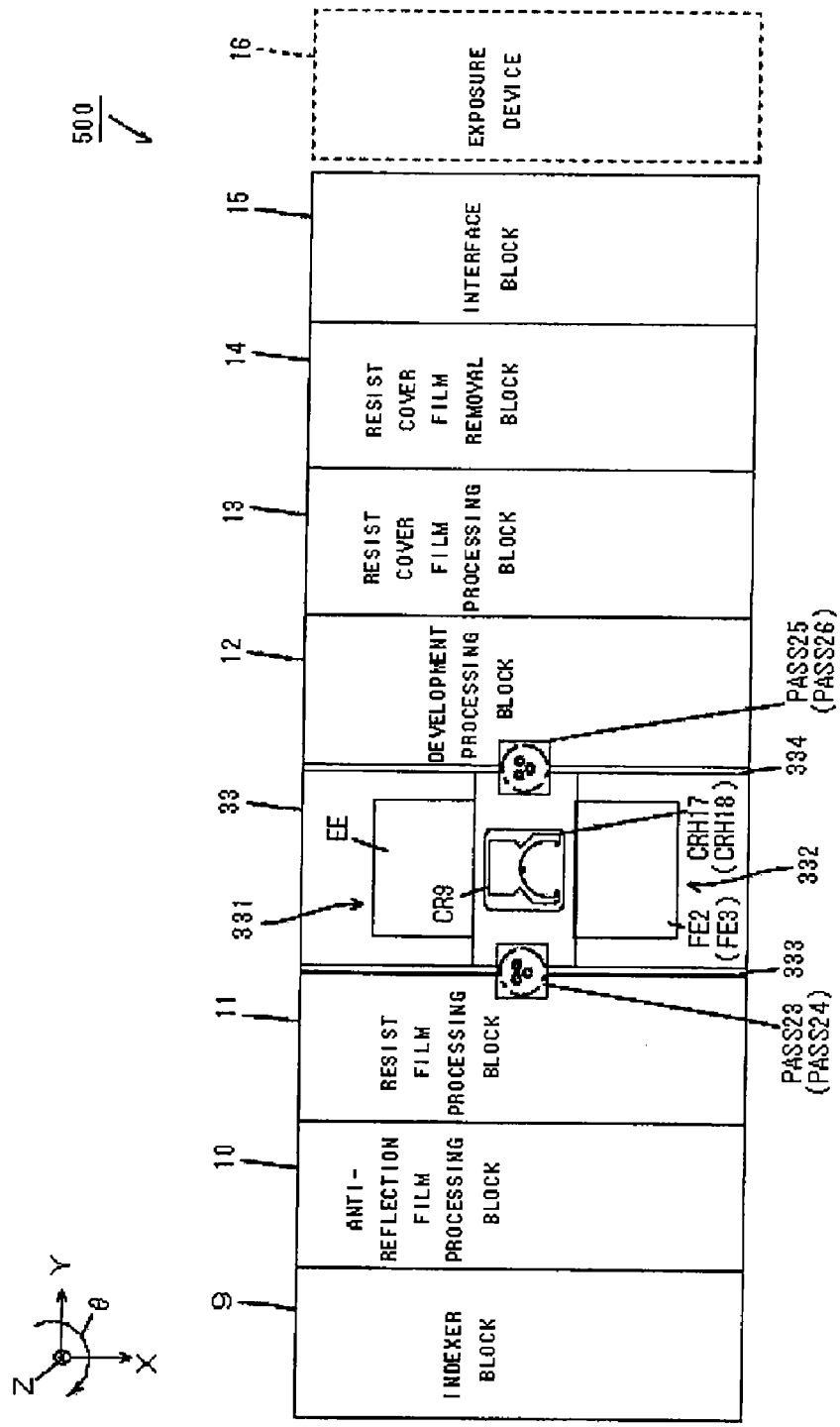
FIG. 18 is a plan view of a substrate processing apparatus according to a fourth embodiment.

As to a substrate processing apparatus 500 according to a fourth embodiment, the difference from the substrate processing apparatus 500 according to the first embodiment will be then described. FIG. 18 is a plan view of the substrate processing apparatus 500 according to the fourth embodiment. In FIG. 18, each of processing blocks is illustrated in simplified fashion.

As shown in FIG. 18, the substrate processing apparatus 500 according to the fourth embodiment includes an inspection block 33 between a resist film processing block 11 and a development processing block 12. The inspection block 33 includes a ninth central robot CR9 and substrate inspection groups 331 and 332.

The substrate inspection groups 331 and 332 are opposed to each other with the ninth central robot CR9 sandwiched therebetween. The substrate inspection group 331 has a vertical stack of a plurality of bevel portion inspection units EE. The substrate inspection group 332 has a vertical stack of a plurality of line width inspection units FE2 and a plurality of overlay inspection unit FE3. The ninth central robot CR9 has hands CRH17 and CRH18 provided one above the other for receiving and transferring substrates W.

A partition wall 333 is provided between the resist film processing block 11 and the inspection block 33 for shielding an atmosphere, and a partition wall 334 is provided between the inspection block 33 and the development processing block 12 for shielding an atmosphere. The partition wall 333 has substrate platforms PASS23 and PASS24 provided in close proximity one above the other for receiving and transferring the substrates W between the resist film processing block 11 and the inspection block 33. The upper substrate platform PASS23 is used in transporting the substrates W from the resist film processing block 11 to the inspection block 33, and the lower substrate platform PASS24 is used in transporting the substrates W from the inspection block 33 to the resist film processing block 11.

The partition wall 334 has substrate platforms PASS25 and PASS26 provided in close proximity one above the other for receiving and transferring the substrates W between the inspection block 33 and the development processing block 12. The upper substrate platform PASS25 is used in transporting the substrates W from the inspection block 33 to the development processing block 12, and the lower substrate platform PASS26 is used in transporting the substrates W from the development processing block 12 to the inspection block 33.

In the inspection block 33, the bevel portion inspection unit EE inspects a bevel portion of the substrate W before or after exposure processing. The line width inspection unit FE2 inspects the line width of a pattern formed on the substrate W by development processing. The overlay inspection unit FE3 inspects the overlay precision of each of layers composing the pattern formed on the substrate W by the development processing.

Note that each of the inspection blocks 32 and 33 respectively shown in FIGS. 17 and 18 may be further provided with other inspection units for making macro inspection or the like of the substrates W.

(E) FIFTH EMBODIMENT

As to a substrate processing apparatus 500 according to a fifth embodiment, the difference from the substrate processing apparatus 500 according to the first embodiment will be then described. In the fifth embodiment, an end portion of a substrate W is inspected in coating units BARC, RES, and COV and a development processing unit DEV.

(E-1) End Portion of Substrate

Figure 19:
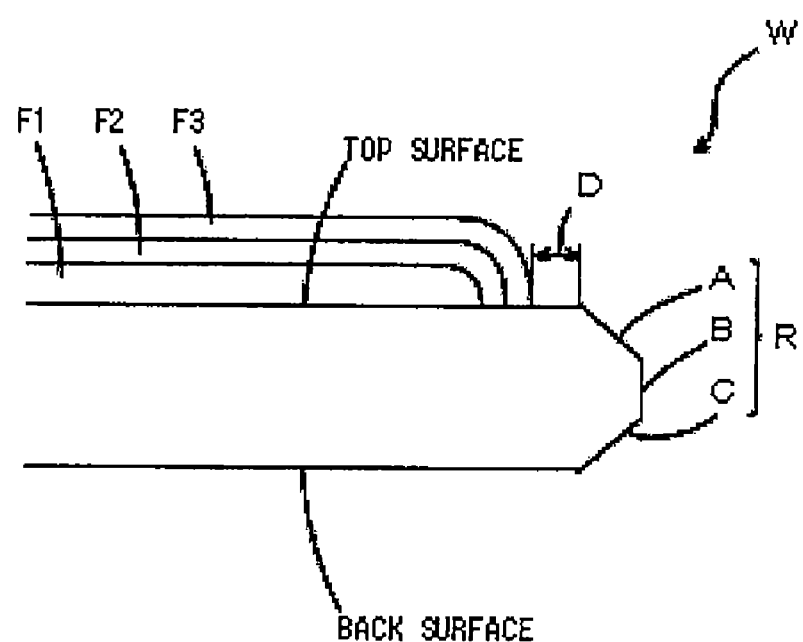
FIG. 19 is a diagram schematically showing an end portion of a substrate.

The definition of an end portion of a substrate W is shown herein. FIG. 19 is a diagram schematically showing the end portion of the substrate W.

As described above, the substrate W has a flat top surface and back surface, and has a bevel portion R including an upper bevel region A, a lower bevel region C, and an end surface region B on its outer peripheral portion.

An anti-reflection film F1, a resist film F2, and a resist cover film F3 are formed in this order on the top surface of the substrate W. A region where each of the films F1, F2, and F3 is to be formed is previously determined. In an example shown in FIG. 19, each of the films F1, F2, and F3 is formed in a region, excluding a peripheral region D, on the top surface of the substrate W.

In the present embodiment, the end portion of the substrate W refers to the bevel portion R of the substrate W and a region on the top surface thereof where none of the films F1, F2, and F3 are formed. In the example shown in FIG. 19, the bevel portion R and the peripheral region D are referred to as the end portion of the substrate W.

Note that each of the films F1, F2, and F3 may be also formed in the upper bevel region A in the bevel portion R. In the case, a region of the upper bevel region A where none of the films F1, F2, and F3 are formed, the end surface region B, and the lower bevel region C, are referred to as the end portion of the substrate W.

(E-2) Coating Unit

The details of the coating units BARC, RES, and COV in the fifth embodiment will be described. The respective configurations of the coating units BARC, RES, and COV are approximately equal to one another.

(E-2-1) Coating Unit BARC (E-2-1-1) Configuration

Figure 20:
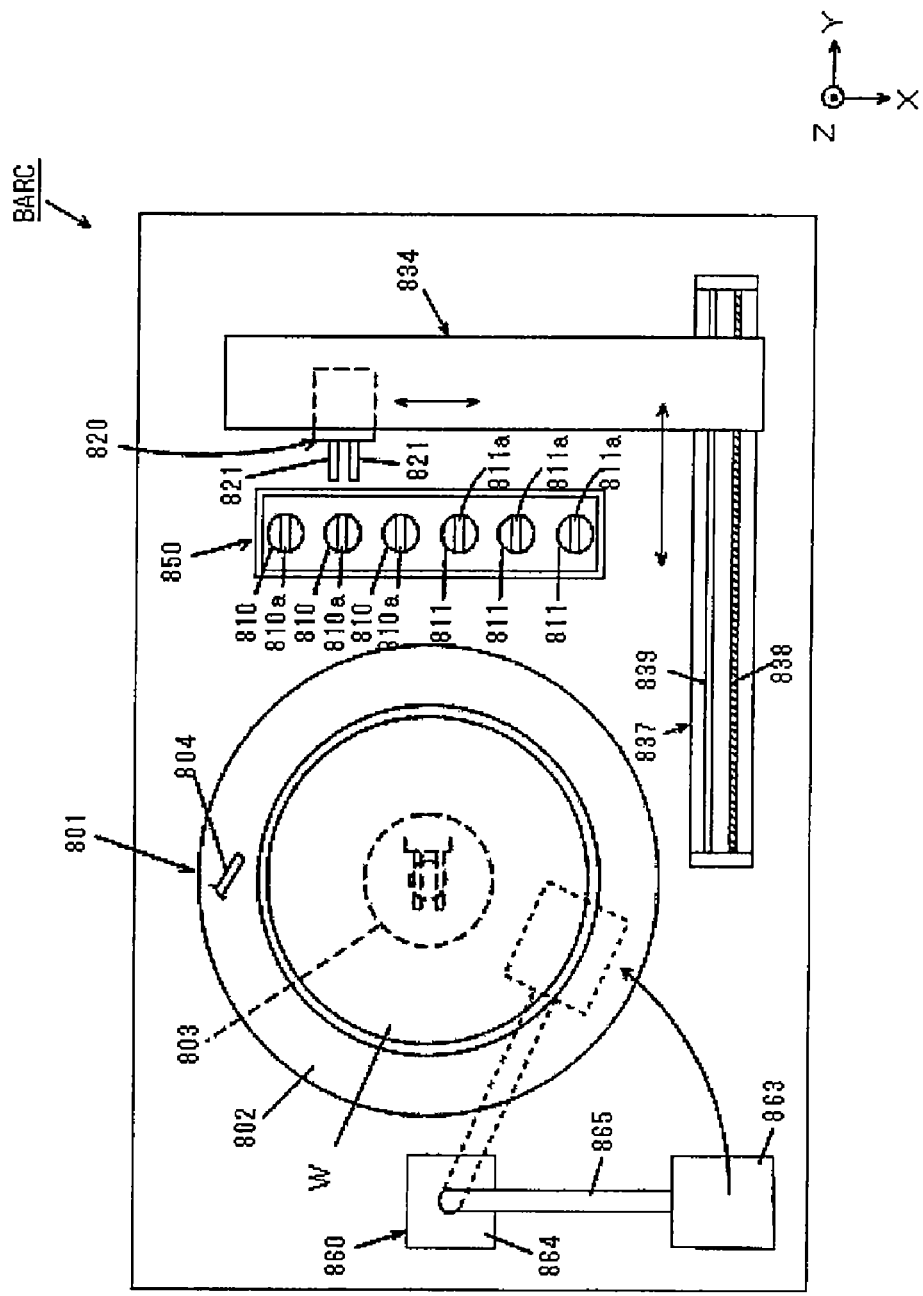
FIG. 20 is a plan view showing the configuration of a coating unit BARC.

FIG. 20 is a plan view showing the configuration of the coating unit BARC. As shown in FIG. 20, the coating unit BARC includes a rotation processor 801, a plurality of (three in this example) coating liquid supply nozzles 810, a plurality of (three in this example) stripping liquid supply nozzles 811, a nozzle gripper 820, gripper moving mechanisms 834 and 837, a waiting portion 850, and an end portion inspector 860.

The rotation processor 801 includes a spin chuck 803 for rotating a substrate W with the substrate W held in a horizontal attitude by suction, and a hollow cup 802, surrounding the spin chuck 803, for preventing an organic solvent or a processing liquid scattered from the substrate W from being diffused outward.

A back rinse nozzle (not shown) for discharging a rinse liquid (e.g., pure water) toward a lower surface of the substrate W held in the spin chuck 803 is provided in the vicinity of the spin chuck 803. An edge rinse nozzle 804 is movably provided above the spin chuck 803. The edge rinse nozzle 804 discharges a rinse liquid (e.g., pure water) to a peripheral portion of the substrate W held by the spin chuck 803.

In awaiting time period, each of the coating liquid supply nozzles 810 and each of the stripping liquid supply nozzles 811 are inserted into the waiting portion 850. A coating liquid for an anti-reflection film is supplied to each of the coating liquid supply nozzles 810 from a coating liquid storage (not shown) through a processing liquid pipe (not shown). A stripping liquid for an anti-reflection film is supplied to each of the stripping liquid supply nozzles 811 from a stripping liquid storage (not shown) through a processing liquid pipe (not shown).

Note that the types of coating liquids respectively supplied to the plurality of (three in this example) coating liquid supply nozzles 810 differ from one another. The coating liquid supplied to the substrate W is suitably selected in accordance with previously set processing conditions, as described later.

Each of the coating liquid supply nozzles 810 is provided with a gripper 810a projecting upward. Each of the stripping liquid supply nozzles 811 is provided with a gripper 811a projecting upward.

The nozzle gripper 820 includes a pair of holding arms 821 for holding the respective grippers 810a and 811a in the coating liquid supply nozzle 810 and the stripping liquid supply nozzle 811. The holding arms 821 move in the direction nearer to each other or in the direction away from each other by a driving mechanism (not shown).

The nozzle gripper 820 is attached to the gripper moving mechanism 834. The gripper moving mechanism 834 causes the nozzle gripper 820 to move in the X direction and the Z direction. The gripper moving mechanism 834 has its one end engaged with a rotating screw 838 in the gripper moving mechanism 837. The rotating screw 838 is rotated by a motor (not shown). The rotation of the rotating screw 838 causes the gripper moving mechanism 834 to horizontally move in the Y direction along a guide 839. This causes the nozzle gripper 820 to move in the Y direction.

The end portion inspector 860 has an inspection head 863. The inspection head 863 is attached to a front end of a rotating arm 865 rotated by a motor 864. The inspection head 863 irradiates laser light onto an end portion of the substrate W held in the spin chuck 803, and detects its scattered light to inspect the state of the end portion of the substrate W. The results of the inspection of the end portion of the substrate W by the inspection head 863 are given to the main controller 30 shown in FIG. 1.

(E-2-1-2) Operation

Figure 21:
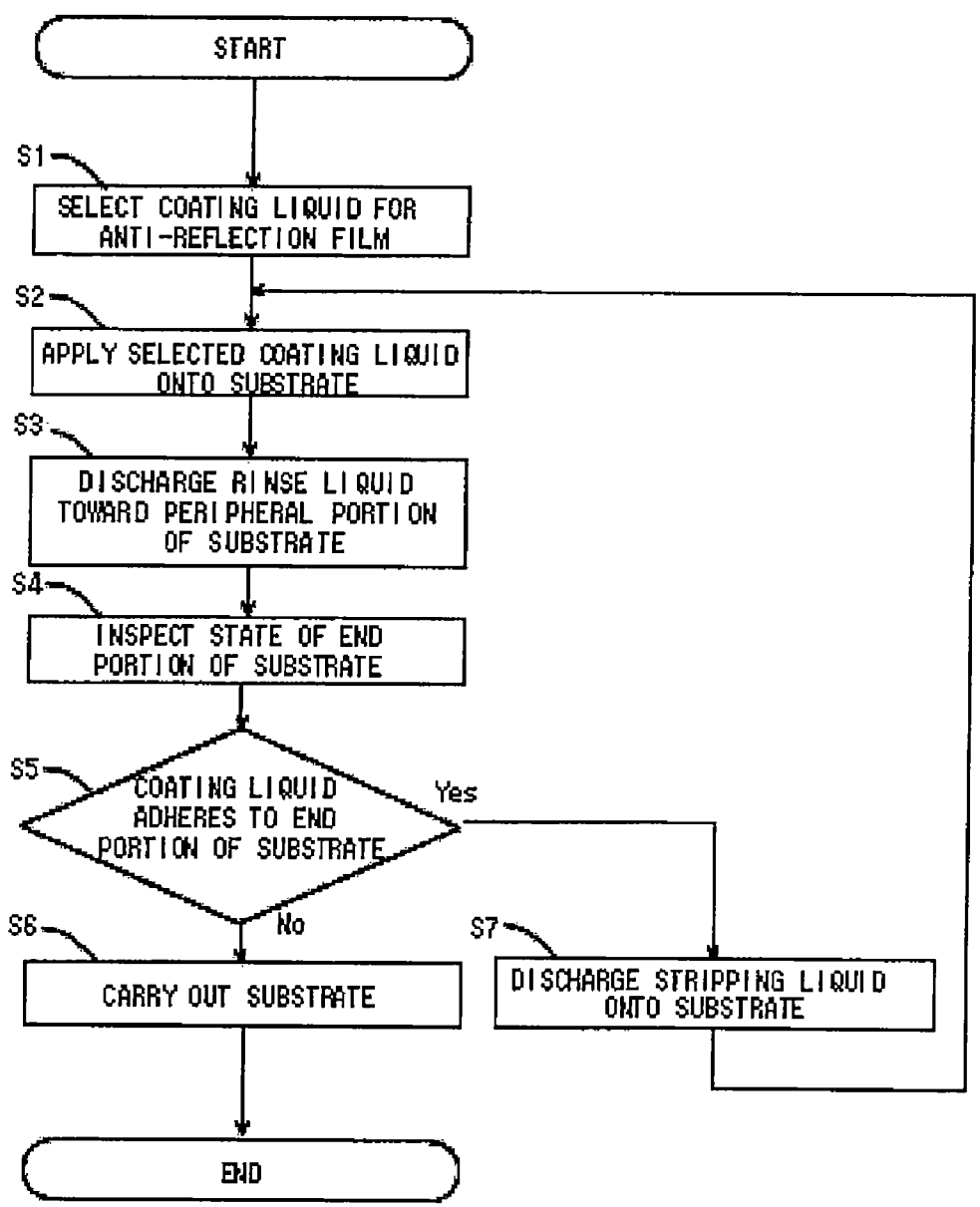
FIG. 21 is a schematic flow chart showing a control operation of a main controller.

The operation of the coating unit BARC having the above-mentioned configuration will be then described using the drawings. The operation of the coating unit BARC is controlled by the main controller 30 shown in FIG. 1. FIG. 21 is a schematic flow chart showing a control operation of the main controller 30.

As shown in FIG. 21, the main controller 30 selects a coating liquid supplied to the substrate W in accordance with predetermined processing conditions, and selects the corresponding coating liquid supply nozzle 810 (step S1).

When the coating liquid supply nozzle 810 is selected, the gripper moving mechanisms 834 and 837 respectively cause the nozzle gripper 820 to come closer to the gripper 810*a* in the coating liquid supply nozzle 810 selected with the pair of holding arms 821 opened.

The gripper 810*a* in the coating liquid supply nozzle 810 is held between the holding arms 821. Furthermore, the held coating liquid supply nozzle 810 is lifted upward, and the gripper moving mechanisms 834 and 837 move the coating liquid supply nozzle 810 to a predetermined position above the center of the substrate W.

Then, the main controller 30 discharges a coating liquid from the coating liquid supply nozzle 810 onto the substrate W while causing the spin chuck 803 to rotate the substrate W, to apply the coating liquid onto the substrate W (step S2). At this time, a rinse liquid is discharged toward a lower surface of the substrate W from a back rinse nozzle (not shown) positioned below the substrate W. This can prevent the coating liquid from adhering to the lower substrate of the substrate W. When the discharge of the coating liquid is terminated, the coating liquid supply nozzle 810 is returned to a predetermined position of the waiting portion 850 shown in FIG. 20.

Then, the main controller 30 moves the edge rinse nozzle 804 to the vicinity of a peripheral portion of the substrate W, and discharges the rinse liquid toward the peripheral portion of the substrate W from the edge rinse nozzle 804 (step S3). This causes the coating liquid that adheres to the peripheral portion of the substrate W to be removed by dissolving. After a predetermined time period has elapsed, the discharge of the rinse liquid from the edge rinse nozzle 804 is stopped, to move the edge rinse nozzle 804 outward from the substrate W.

Then, the main controller 30 causes the motor 864 to move the inspection head 30 to the vicinity of the end portion of the substrate W. The inspection head 863 inspects the state of the end portion of the substrate W with the rotation of the substrate W maintained (step S4).

Then, the main controller 30 determines whether or not the coating liquid adheres to the end portion of the substrate W on the basis of the results of the inspection by the inspection head 863 (step S5). That is, it is determined whether or not the coating liquid adheres to a portion where an anti-reflection film should not be formed.

Specifically, when the intensity of the scattered light of the laser light detected by the inspection head 863 is within a predetermined range, it is determined that the coating liquid does not adhere to the end portion of the substrate W. On the other hand, when the intensity of the scattered light is outside the predetermined range, it is determined that the coating liquid adheres to the end portion of the substrate W.

When the coating liquid does not adhere to the end portion of the substrate W, the main controller 30 stops the rotation of the substrate W by the spin chuck 803, to cause the first central robot CR1 (FIG. 1) to carry the substrate W out of the coating unit BARC (step S6).

When the coating liquid adheres to the end portion of the substrate W, the main controller 30 causes the nozzle gripper 820 to move any one of the stripping liquid supply nozzles 811 to a predetermined position above the center of the substrate W. The main controller 30 discharges the stripping liquid onto the substrate W from the stripping liquid supply nozzle 811 with the rotation of the substrate W maintained (step S7). This causes the coating liquid applied on the substrate W to be removed.

Thereafter, the main controller 30 scatters the coating liquid and the stripping liquid on the substrate W by increasing the rotational speed of the substrate W, and applies the coating liquid on the substrate W again upon returning to the step S2.

After the coating unit BARC thus applies the coating liquid for the anti-reflection film on the substrate W, the inspection head 863 inspects the state of the end portion of the substrate W. When the coating liquid adheres to the end portion of the substrate W as a result of the inspection, the coating liquid on the substrate W is removed once, and a coating liquid is applied on the substrate W anew. This allows an anti-reflection film to be formed in a suitable region on the substrate W while keeping the end portion of the substrate W clean.

Note that it is difficult to remove the anti-reflection film from the substrate W after the anti-reflection film on the substrate W is subjected to heat treatment in the thermal processing groups 100, 101, 110 and 111 for anti-reflection film and resist film (FIG. 1). In the present embodiment, the above-mentioned processing is performed before the anti-reflection film is subjected to heat treatment. This allows the anti-reflection film to be reliably removed. Therefore, the end portion of the substrate W can be reliably kept clean.

(E-2-2) Coating Unit RES

The coating unit RES has the same configuration as the coating unit BARC except that a coating liquid for a resist film is used in place of the coating liquid for the anti-reflection film and a stripping liquid for a resist film is used in place of the stripping liquid for the anti-reflection film.

In the coating unit RES, a substrate W is subjected to the same processing as that in the coating unit BARC. Specifically, the coating liquid for the resist film is first applied on the substrate W having an anti-reflection film formed thereon. Then, an inspection head 863 (see FIG. 20) inspects the state of an end portion of the substrate W. Unless the coating liquid for the resist film adheres to the end portion of the substrate W as a result of the inspection, the substrate W is carried out of the coating unit RES.

On the other hand, if the coating liquid for the resist film adheres to the end portion of the substrate W, the stripping liquid for the resist film is supplied onto the substrate W. In this case, the state of the anti-reflection film on the substrate W is maintained, so that only the coating liquid for the resist film is removed. Thereafter, the coating liquid for the resist film is applied anew on the substrate W, and the inspection head 863 inspects the end portion of the substrate W again.

This allows the resist film to be formed in a suitable region on the substrate W while keeping the end portion of the substrate W clean.

(E-2-3) Coating Unit COV

The coating unit COV has the same configuration as the coating unit BARC except that a coating liquid for a resist cover film is used in place of the coating liquid for the anti-reflection film and a stripping liquid for a resist cover film is used in place of the stripping liquid for the anti-reflection film.

In the coating unit COV, a substrate W is subjected to the same processing as that in the coating unit BARC. Specifically, the coating liquid for the resist cover film is first applied on the substrate W having an anti-reflection film and a resist film formed thereon. Then, an inspection head 863 (see FIG. 20) inspects the state of an end portion of the substrate W. Unless the coating liquid for the resist cover film adheres to the end portion of the substrate W as a result of the inspection, the substrate W is carried out of the coating unit COV.

On the other hand, if the coating liquid for the resist cover film adheres to the end portion of the substrate W, the stripping liquid for the resist cover film is supplied onto the substrate W. In this case, the respective states of the anti-reflection film and the resist film on the substrate W are maintained, so that only the coating liquid for the resist cover film is removed. Thereafter, the coating liquid for the resist cover film is applied anew on the substrate W, and the inspection head 863 inspects the end portion of the substrate W again.

This allows the resist cover film to be formed in a suitable region on the substrate W while keeping the end portion of the substrate W clean.

(E-3) Development Processing Unit DEV

Figure 22:
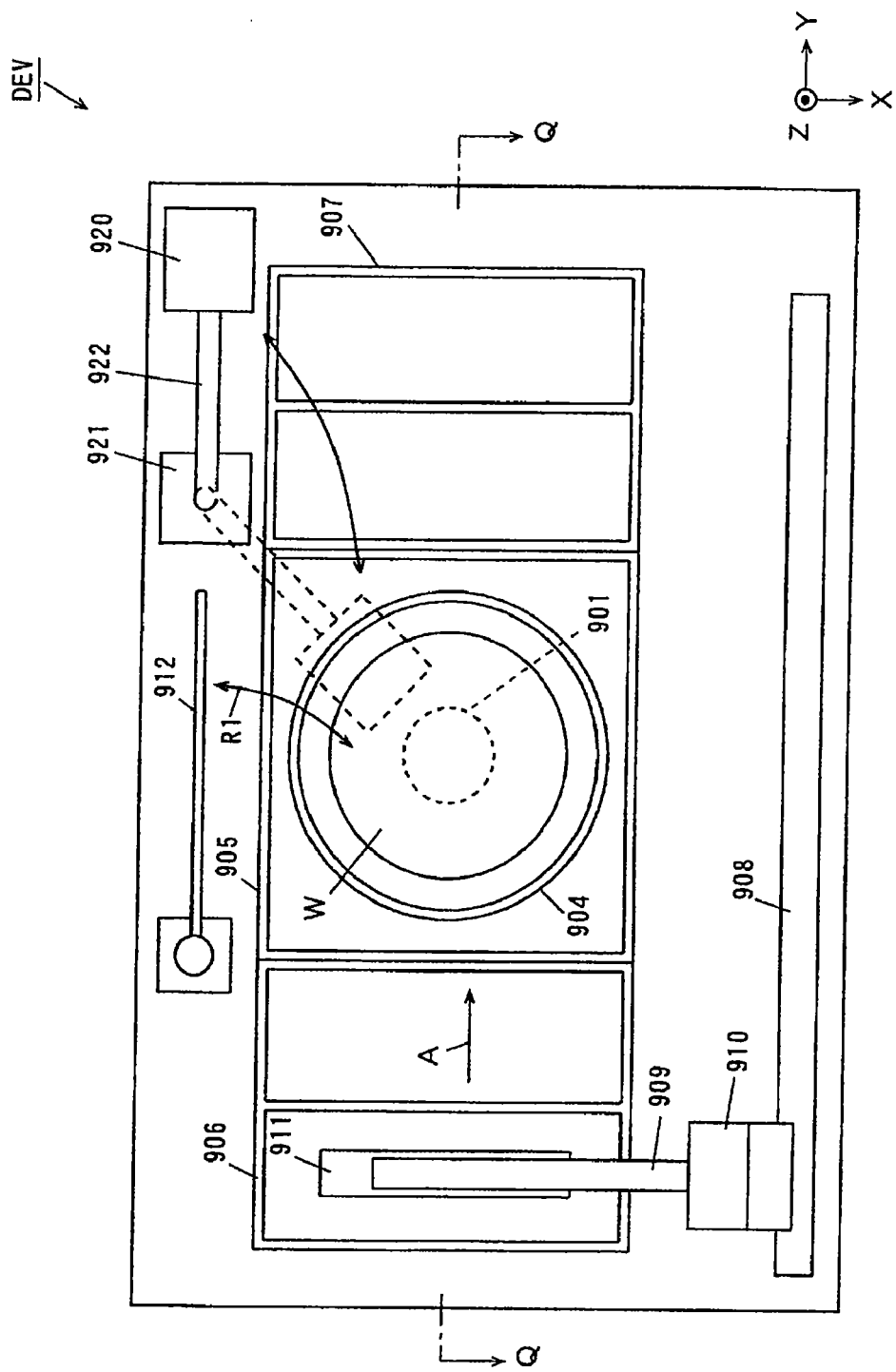
FIG. 22 is a plan view showing the configuration of a development processing unit DEW.

The details of the development processing unit DEV will be then described. FIG. 22 is a plan view showing the configuration of the development processing unit DEV, and FIG. 23 is a cross-sectional view taken along a line Q-Q of the development processing unit DEV shown in FIG. 22.

Figure 23:
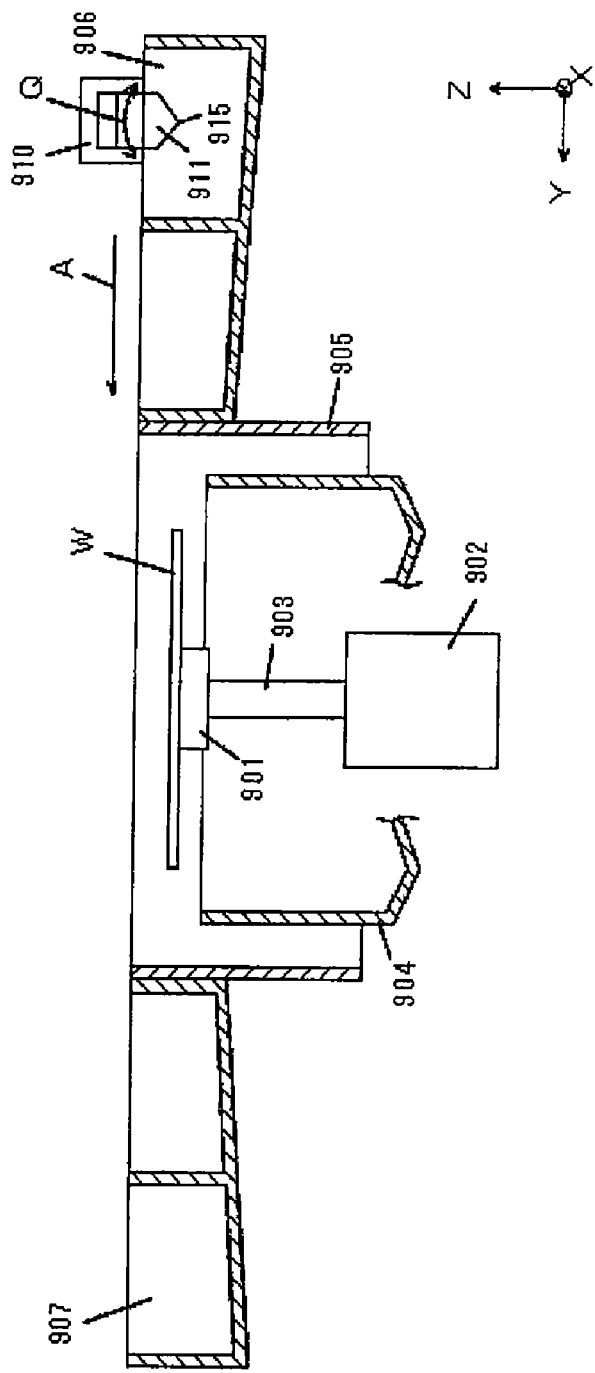
FIG. 23 is a cross sectional view taken along a line Q-Q of the development processing unit DEW shown in FIG. 22.

As shown in FIGS. 22 and 23, the development processing unit DEV includes a spin chuck 901 for holding a substrate W in a horizontal attitude by suction. The spin chuck 901 is secured to a front end of a rotating shaft 903 in a motor 902 (FIG. 23), and is rotatable around its vertical axis. A circular inner cup 904 is movable up and down so as to surround the substrate W around the spin chuck 901. A square outer cup 905 is provided around the inner cup 904.

Waiting pods 906 and 907 are respectively arranged on both sides of the outer cup 905, and a guide rail 908 is disposed on the outer side of one surface of the outer cup 905. Furthermore, a nozzle arm 909 is provided so as to be movable in a scanning direction A and a direction opposite thereto along the guide rail 908 by an arm driver 910. A rinse liquid discharge nozzle 912 for cleaning that discharges pure water as a rinse liquid for cleaning is provided so as to be rotatable in a direction indicated by an arrow RI on the outer side of the other surface of the outer cup 905.

Furthermore, an inspection head 920 is arranged on the outer side of the other surface of the outer cup 905. The inspection head 920 is attached to a front end of a rotating arm 922 rotated by a motor 921. The inspection head 920 has the same configuration as the inspection head 863 shown in FIG. 20, and irradiates laser light onto an end portion of the substrate W held in the spin chuck 901 and detects its scattered light to inspect the state of the end portion of the substrate W.

A development liquid discharge nozzle 911 having a slit-shaped discharge port 915 (see FIG. 23) at its lower end is attached to the nozzle arm 909 perpendicularly to the guide rail 908. A development liquid supplying system (not shown) supplies a development liquid to the development liquid discharge nozzle 911.

When the substrate W is subjected to development processing, the development liquid discharge nozzle 911 moves to a position within the outer cup 905 from the position of the waiting pod 906. The development liquid discharge nozzle 911 passes above the substrate W in a stationary state while discharging the development liquid. This causes the development liquid to be held on the whole surface of the substrate W so that the development processing progresses. The development liquid discharge nozzle 911 moves to a position of the waiting pod 907, and then returns to the position of the waiting pod 906.

After an elapse of a predetermined time period, the rinse liquid is discharged onto the substrate W from the rinse liquid discharge nozzle 912. This causes the development processing on the substrate W to be stopped. Note that the development liquid discharge nozzle 911 that has returned to the position of the waiting pod 906 may move above the substrate W while discharging the rinse liquid to stop the development processing on the substrate W.

Thereafter, the substrate W is rotated at high speed, so that the development liquid and the rinse liquid on the substrate W are scattered, to dry the substrate W. This causes the development processing for the substrate W to be terminated. After the termination of the development processing, the inspection head 920 moves to the vicinity of the end portion of the substrate W. The inspection head 920 inspects the state of the end portion of the substrate W with the substrate W rotated. The results of the inspection by the inspection head 920 are given to the main controller shown in FIG. 1. Thereafter, the substrate W is carried out of the development processing unit DEV.

As described above, the substrate W carried out of the development processing unit DEV is stored in the carrier C by the indexer robot IR (FIG. 1) in the indexer block 9 (FIG. 1).

In the present embodiment, the main controller 30 (FIG. 1) controls the indexer robot IR on the basis of the results of the inspection by the inspection head 920 in the development processing unit DEV, so that the substrate W whose end portion is determined to be contaminated and the substrate W whose end portion is determined that it is not contaminated are respectively stored within the separate carriers C.

(E-4) Effect of Fifth Embodiment

In the fifth embodiment, the coating units BARC, RES, and COV respectively coat the substrate W with an anti-reflection film, a resist film, and a resist cover film, and the inspection head 863 then inspects the state of the end portion of the substrate W. The substrate W is subjected to predetermined processing in accordance with the results of the inspection, to prevent the substrate W from being fed to the subsequent process from the coating units BARC, RES, and COV with the end portion of the substrate W contaminated.

Therefore, the substrate W can be carried into the exposure device 16 with the end portion thereof kept clean. This can prevent contamination in the exposure device 16 due to contamination of the end portion of the substrate W. As a result, a defective dimension and a defective shape of an exposure pattern can be prevented.

Furthermore, in each of the coating units, the end portion of the substrate W can be subjected to coating processing in a clean state. Therefore, each of the films can be satisfactorily formed.

In the development processing block DEV, the inspection head 920 inspects the state of the end portion of the substrate W after development processing. The substrate W whose end portion is determined to be contaminated and the substrate whose end portion is determined that it is not contaminated by the inspection are respectively stored in the separate carriers C. This can prevent the substrate W whose end portion is contaminated from being fed as it is to the subsequent processing process from the substrate processing apparatus 500.

(E-5) Modification (E-5-1)

In the coating units BARC, RES, and COV in the above-mentioned embodiment, when the coating liquid for the anti-reflection film, the resist film, or the resist cover film adheres to the end portion of the substrate W, the whole coating liquid on the substrate W is removed. However, the present invention is not limited to the same. For example, only the coating liquid that adheres to the end portion of the substrate W may be removed.

Specifically, only the coating liquid that adheres to the end portion of the substrate W can be removed with the coating liquid applied to a suitable region on the substrate W left as it is by supplying the stripping liquid to only the end portion of the substrate W from the stripping liquid supply nozzle 811. Furthermore, the coating liquid that adheres to the end portion of the substrate W can be also removed by supplying the rinse liquid to the end portion of the substrate W again from the edge rinse nozzle 804.

(E-5-2)

A method of removing a coating liquid may be selected depending on the degree of adhesion of the coating liquid to the end portion of the substrate W. For example, as a result of the inspection by the inspection head 863, the whole coating liquid on the substrate W is removed by the stripping liquid supply nozzle 811 when the coating liquid significantly adheres to the end portion of the substrate W, and only the coating liquid that adheres to the end portion of the substrate W is removed by the stripping liquid supply nozzle 811 or the edge rinse nozzle 804 when the coating liquid slightly adheres to the end portion of the substrate W.

Note that the stripping liquid supply nozzle 811 for removing the whole coating liquid on the substrate W and the stripping liquid supply nozzle 811 for removing only the coating liquid that adheres to the end portion of the substrate W may be separately provided to have different configurations in this case.

For example, the diameter of a discharge port of the stripping liquid supply nozzle 811 for removing only the coating liquid that adheres to the end portion of the substrate W is set below the diameter of a discharge port of the stripping liquid supply nozzle 811 for removing the whole coating liquid on the substrate W. In this case, when the whole coating liquid on the substrate is removed, the stripping liquid can be efficiently supplied to the whole surface of the substrate W. On the other hand, when only the coating liquid that adheres to the end portion of the substrate W is removed, the stripping liquid can be supplied to only the end portion of the substrate W more accurately.

(E-5-3)

In each of the coating units BARC, RES, and COV, a plurality of types of coating liquids are used. A plurality of types of stripping liquids may be used so as to respectively correspond to the plurality of types of coating liquids. Specifically, a plurality of types of stripping liquids that differ from one another are respectively supplied to the plurality of stripping liquid supply nozzles 811. When the coating liquid on the substrate W is removed, the stripping liquid that can effectively remove the coating liquid is selected. In this case, the coating liquid on the substrate W can be removed reliably and efficiently.

(E-5-4)

Figure 24:
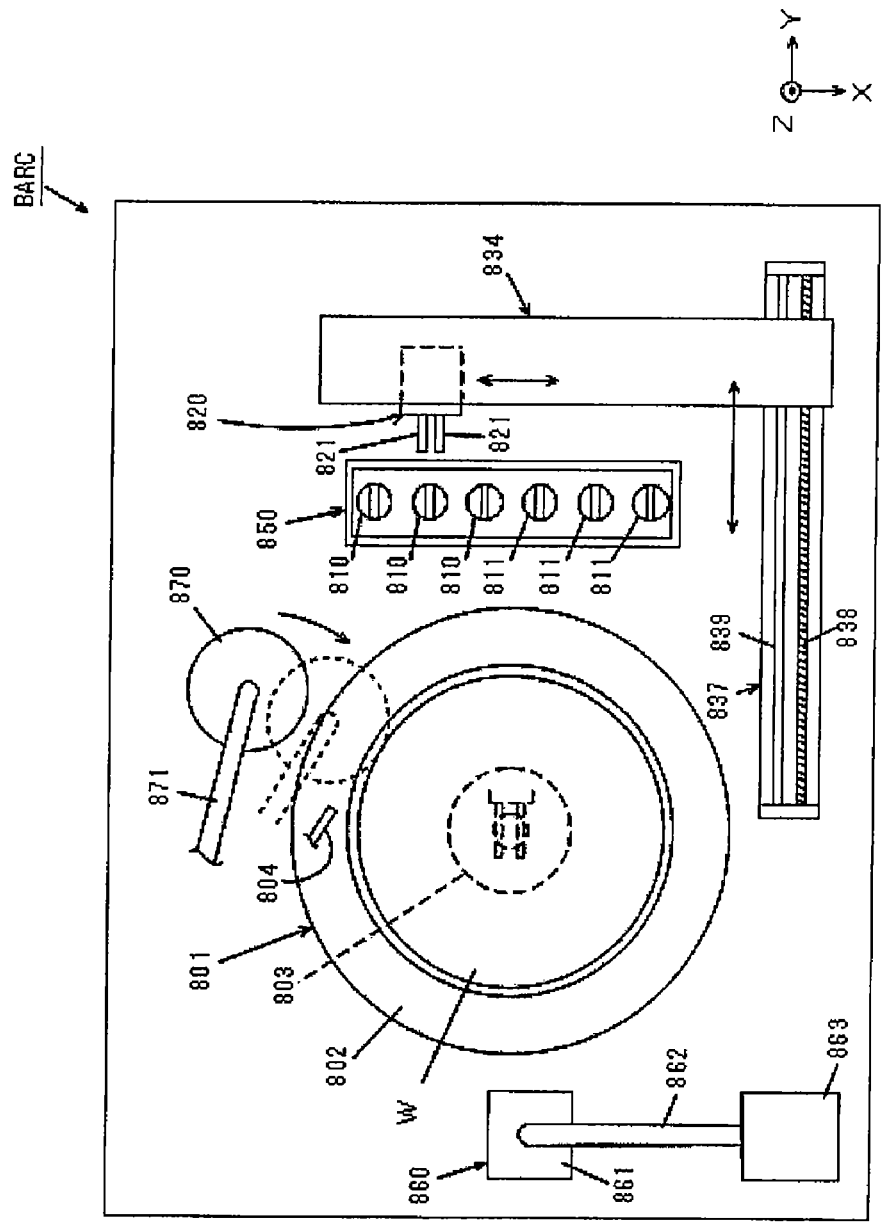
FIG. 24 is a plan view showing a modified example of a coating unit BARC.

As respective modifications of the coating units BARC, RES, and COV, the coating unit BARC will be described as an example using FIG. 24. FIG. 24 is a plan view showing the modification of the coating unit BARC. The difference between the coating unit BARC shown in FIG. 24 and the coating unit BARC shown in FIG. 20 will be described.

The coating unit BARC shown in FIG. 24 is provided with a cleaning brush 870 for cleaning an end portion of a substrate W. The cleaning brush 870 is held by a holding arm 871, and the holding arm 871 is driven by a driving mechanism (not shown). This causes the cleaning brush 870 to move in the direction nearer to or away from the end portion of the substrate W held in a spin chuck 803.

In the coating unit BARC, when a coating liquid adheres to the end portion of the substrate W as a result of inspection by an inspection head 863, the cleaning brush 870 cleans the end portion of the substrate W. This allows the coating liquid that adheres to the end portion of the substrate W to be removed with the coating liquid applied to a suitable region on the substrate W maintained as it is.

Even when the cleaning brush 870 is provided in the coating units RES and COV, the same function and effect can be obtained.

Note that the bevel cleaners 530, 560, and 570 shown in FIGS. 5, 11, 12, and 13 may be also respectively provided in the coating units BARC, RES, and COV.

(E-5-5)

In the fifth embodiment, when it is determined as a result of the inspection by the inspection head 863 that the coating liquid adheres to the end portion of the substrate W in the coating units BARC, RES, and COV, only the coating liquid applied within the common coating unit is removed. In the coating units RES and COV, however, all the films formed on the substrate W may be removed. In this case, the substrate W is returned to the coating unit BARC from the coating units RES or COV, and films are formed anew, beginning with an anti-reflection film, on the substrate W.

(E-5-6)

Although in the fifth embodiment, each of the coating units BARC, RES, and COV is provided with the inspection head 863, only one or two types of the coating units BARC, RES, and COV may be provided with the inspection head 863, provided that the end portion of the substrate W can be kept clean.

(E-5-7)

The removal unit REM may be provided with the same inspection device as the inspection heads 865 and 920. In this case, the state of the end portion of the substrate W is inspected after the substrate W is subjected to resist cover film removal processing, and the substrate W whose end portion is determined to be contaminated is subjected to resist cover film removal processing again.

This prevents the substrate W from being fed to the subsequent process with a residue of the resist cover film adhering to the end portion thereof. Therefore, the development processing in the development processing unit DEV can be satisfactorily performed.

(F) ANOTHER EMBODIMENT

A bevel portion inspection unit EE may be provided within an anti-reflection film processing block 10, a resist film processing block 11, a development processing block 12, a resist cover film processing block 13, or a resist cover film removal block 14.

First and second cleaning/drying processing units SD1 and SD2 are not limited to an interface block 15. For example, they may be provided in another processing block such as the resist cover film removal block 14.

Another inspection unit such as a film thickness inspection unit FF1 may be provided with the function of a bevel portion inspection unit EE.

The respective numbers of bevel portion inspection units EE, first cleaning/drying processing units SD1, drying processing units SD2, coating units BARC, RES, and COV, development processing units DEV, removal units REM, heating units FP, cooling units CP, placement/cooling units P-CP, film thickness inspection units FE1, line width inspection units FE2, and overlay inspection units FE3 are suitably changed depending on the processing speed of each of the processing blocks.

(G) CORRESPONDENCES BETWEEN CONSTITUENT ELEMENTS IN THE CLAIMS AND PARTS IN EMBODIMENTS

In the following paragraphs, non-limiting examples of correspondences between various elements recited in the claims below and those described above with respect to various preferred embodiments of the present invention are explained.

In the embodiments described above, the indexer block 9, the anti-reflection film processing block 10, the resist film processing block 11, the development processing block 12, the resist cover film processing block 13, the resist cover film removal block 14, the bevel portion inspection block 31, and the inspection blocks 32 and 33 are examples of a processing section, the interface block 15 is an example of an interface, the main controller 30 is an example of a controller, and the bevel portion inspection unit EE is an example of a bevel portion inspection device.

The first cleaning/drying processing unit SD1 is an example of a cleaning processing unit, the bevel cleaner 530 is an example of a bevel portion cleaning mechanism, the alarm buzzer or the alarm lamp is an example of an alarm generation device, the coating units BARC, RES, and COV are examples of a film formation unit, the carrier C is an example of a storing container, and the indexer robot IR is an example of a transport device.

The coating unit BARC, RES, and COV, the development processing unit DEV, and the removal unit REM are examples of a processing unit, the inspection head 863 and 920 are examples of an end portion inspection device, the coating units BARC, RES, and COV are examples of a film formation processing unit, the coating liquid supply nozzle 810 is an example of a processing liquid supplier, the stripping liquid supply nozzle 811 and the edge rinse nozzle 804 are examples of a processing liquid remover.

Furthermore, the coating unit RES is an example of a photosensitive film formation unit, the coating unit BARC is an example of an anti-reflection film formation unit, and the coating unit COV is an example of a protective film formation unit.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus disposed adjacent to an exposure device, the substrate processing apparatus comprising:
    a processing section for subjecting a substrate to processing;
    an interface provided adjacent to one end of the processing section for receiving and transferring the substrate between the processing section and the exposure device; and
    a controller that controls the respective operations of the processing section and the interface,
    wherein at least one of the processing section or the interface includes a bevel portion inspection device that inspects the state of a bevel portion of the substrate to determine whether or not the bevel portion of the substrate is contaminated; and
    the controller performs a first control operation when the bevel portion inspection device determines that the bevel portion of the substrate is contaminated and performs a second control operation when the bevel portion inspection device determines that the bevel portion of the substrate is not contaminated.

2. The substrate processing apparatus according to claim 1 wherein:
    the bevel portion inspection device inspects the bevel portion of the substrate before exposure processing by the exposure device; and
    the controller controls the interface such that the substrate is not transported to the exposure device as the first control operation when the bevel portion inspection device determines that the bevel portion of the substrate is contaminated before the exposure processing.

3. The substrate processing apparatus according to claim 2 wherein:
    at least one of the processing section or the interface includes a cleaning processing unit that subjects the substrate to cleaning processing before the exposure processing by the exposure device;
    the bevel portion inspection device inspects the bevel portion of the substrate after the cleaning processing by the cleaning processing unit; and
    the controller controls at least one of the processing section or the interface such that the substrate is not transported to said exposure device as the first control operation when the bevel portion inspection device determines that the bevel portion of the substrate is contaminated after the cleaning processing.

4. The substrate processing apparatus according to claim 3 wherein the controller controls at least one of the processing section or the interface such that the substrate is subjected to the cleaning processing by said cleaning processing unit again as the first control operation when the bevel portion inspection device determines that the bevel portion of the substrate is contaminated.

5. The substrate processing apparatus according to claim 3 wherein the cleaning processing unit includes a bevel portion cleaning mechanism for cleaning the bevel portion of the substrate.

6. The substrate processing apparatus according to claim 2 further comprising:
an alarm generation device that generates an alarm in accordance with the control operation of the controller;
wherein the bevel portion inspection device inspects the bevel portion of the substrate after exposure processing by the exposure device; and
the controller controls the alarm generation device so as to generate the alarm as the first control operation when the bevel portion inspection device determines that the bevel portion of the substrate is contaminated after the exposure processing.

7. The substrate processing apparatus according to claim 1 wherein:
the processing section includes a film formation unit that subjects the substrate to film formation processing before exposure processing by the exposure device;
the bevel portion inspection device inspects the bevel portion of the substrate before film formation processing by the film formation unit; and
the controller controls the processing section such that the substrate is not subjected to the film formation processing by the film formation unit as the first control operation when the bevel portion inspection device determines that the bevel portion of the substrate is contaminated before the film formation processing.

8. The substrate processing apparatus according to claim 1 further comprising:
a transport device that transports the substrate between the processing section and a plurality of storage containers in accordance with the control operation of the controller,
wherein the processing section includes a development processing unit that subjects the substrate to development processing after exposure processing by the exposure device;
wherein the bevel portion inspection device inspects the bevel portion of the substrate after development processing by the development processing unit; and
the controller controls the transport device such that the substrate is stored in one of the plurality of storage containers as the first control operation when the bevel portion inspection device determines that the bevel portion of the substrate is contaminated after development processing, while controlling said transport device such that the substrate is stored in another one of the plurality of storage containers as the second control operation when the bevel portion inspection device determines that the bevel portion is not contaminated.

9. A substrate processing apparatus disposed adjacent to an exposure device, the substrate processing apparatus comprising:
a processing section having a processing unit that subjects a substrate to processing;
an interface disposed adjacent to one end of the processing section for receiving and transferring the substrate between the processing section and the exposure device; and
a controller that controls the respective operations of the processing section and the interface,
wherein the processing unit has an end portion inspection device that inspects the end portion of the substrate after the substrate is subjected to predetermined processing; and
the controller determines whether or not the end portion of the substrate is in a good state based on results of the inspection by the end portion inspection device, to perform a first control operation when the end portion of the substrate is in the good state, while performing a second control operation when the end portion of the substrate is not in a good state.

10. The substrate processing apparatus according to claim 9 wherein:
the processing unit includes a film formation processing unit that subjects the substrate to film formation processing before exposure processing by the exposure device,
the film formation processing unit including:
a processing liquid supplier that dispenses a processing liquid onto the substrate for film formation processing, and
a processing liquid remover that removes the processing liquid dispensed onto the substrate by the processing liquid supplier, and
the end portion inspection device inspects the end portion of the substrate after the processing liquid supplier dispenses the processing liquid onto the substrate in the film formation processing unit.

11. The substrate processing apparatus according to claim 10 wherein the controller uses results of the inspection by the end portion inspection device in the film formation processing unit to determine when the processing liquid does not adhere to the end portion of the substrate and when the processing liquid adheres to the end portion of the substrate and performs the second control operation to control the processing liquid supplier and the processing liquid remover so as to remove the processing liquid supplied onto the substrate and supply the processing liquid onto the substrate again when the processing liquid adheres to the end portion of the substrate.

12. The substrate processing apparatus according to claim 10 wherein the controller uses the results of the inspection by the end portion inspection device in the film formation processing unit to determine when the processing liquid does not adhere to the end portion of the substrate and when the processing liquid adheres to the end portion of the substrate and performs the second control operation to control the processing liquid remover so as to remove the processing liquid that adheres to the end portion of the substrate as when the processing liquid adheres to the end portion of the substrate.

13. The substrate processing apparatus according to claim 10 wherein the film formation processing unit includes a photosensitive film formation unit that forms a photosensitive film on the substrate.

14. The substrate processing apparatus according to claim 13 wherein the film formation processing unit further includes an anti-reflection film formation unit that forms an anti-reflection film on the substrate before the photosensitive film formation unit forms the photosensitive film.

15. The substrate processing apparatus according to claim 13 wherein the film formation processing unit further includes a protective film formation unit that forms a protective film on the substrate for protecting the photosensitive film formed by the photosensitive film formation unit.

16. The substrate processing apparatus according to claim 9 further comprising:

a transport device that transports the substrate between the processing section and a plurality of storage containers in accordance with the control operation of the controller, wherein the processing unit includes a development processing unit that subjects the substrate after exposure processing by the exposure device to development processing; and the end portion inspection device inspects the end portion of the substrate after development processing by the development processing unit; and the controller uses results of the inspection by the end portion inspection device after development processing to determine whether or not the end portion of the substrate is in the good state and performs the first control operation to control the transport device such that the substrate is stored in one of the plurality of storage containers when the end portion of the substrate is in the good state, and performs the second control operation to control the transport device such that the substrate is stored in another one of the plurality of storage containers when the end portion of the substrate is not in the good state.

* * * * *